United States Patent
Lee et al.

(10) Patent No.: US 11,031,308 B2
(45) Date of Patent: Jun. 8, 2021

(54) CONNECTIVITY DETECTION FOR WAFER-TO-WAFER ALIGNMENT AND BONDING

(71) Applicant: SanDisk Technologies LLC, Addison, TX (US)

(72) Inventors: Seungpil Lee, San Ramon, CA (US); Kwang-Ho Kim, Pleasanton, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/426,984

(22) Filed: May 30, 2019

(65) Prior Publication Data

US 2020/0381316 A1    Dec. 3, 2020

(51) Int. Cl.
| | |
|---|---|
| *H01L 25/18* | (2006.01) |
| *H01L 21/66* | (2006.01) |
| *H01L 27/11582* | (2017.01) |
| *H01L 25/00* | (2006.01) |
| *H01L 21/78* | (2006.01) |
| *H01L 23/00* | (2006.01) |
| *G01R 31/50* | (2020.01) |

(52) U.S. Cl.
CPC .............. *H01L 22/34* (2013.01); *G01R 31/50* (2020.01); *H01L 21/78* (2013.01); *H01L 22/20* (2013.01); *H01L 22/32* (2013.01); *H01L 24/06* (2013.01); *H01L 24/08* (2013.01); *H01L 24/89* (2013.01); *H01L 24/94* (2013.01); *H01L 25/18* (2013.01); *H01L 25/50* (2013.01); *H01L 27/11582* (2013.01); *H01L 2224/06515* (2013.01); *H01L 2224/08145* (2013.01); *H01L 2224/80121* (2013.01); *H01L 2224/80908* (2013.01)

(58) Field of Classification Search
None
See application file for complete search history.

(56) References Cited

U.S. PATENT DOCUMENTS

| | | | |
|---|---|---|---|
| 7,514,276 B1 | 4/2009 | Yearous et al. | |
| 10,262,911 B1 * | 4/2019 | Gong | .................. H01L 25/0652 |
| 2002/0195706 A1 * | 12/2002 | Irie | ......................... H05K 3/303 |
| | | | 257/734 |

(Continued)

OTHER PUBLICATIONS

International Search Report & The Written Opinion of the International Searching Authority dated Mar. 23, 2020, International Application No. PCT/US2019/066662.

*Primary Examiner* — Benjamin P Sandvik
(74) *Attorney, Agent, or Firm* — Vierra Magen Marcus LLP

(57) ABSTRACT

A first workpiece includes first active pads, a first test pad, and a second test pad on a primary surface of the first workpiece, the first test pad electrically connected to the second test pad. A second workpiece includes second active pads, a third test pad, and a fourth test pad on a primary surface of the second workpiece. The first and second workpieces are bonded along an interface between the primary surface of the first workpiece and the primary surface of the second workpiece to bond the first active pads with the second active pads, bond the first test pad with the third test pad, and bond the second test pad with the fourth test pad. Connectivity detection circuits test electrical connectivity between the third test pad and the fourth test pad.

20 Claims, 20 Drawing Sheets

(56) References Cited

U.S. PATENT DOCUMENTS

| | | | |
|---|---|---|---|
| 2003/0085461 A1* | 5/2003 | Sakiyama | G01R 31/318513 |
| | | | 257/700 |
| 2006/0202359 A1* | 9/2006 | Chen | H01L 22/32 |
| | | | 257/797 |
| 2008/0272372 A1* | 11/2008 | Luo | H01L 25/0657 |
| | | | 257/48 |
| 2012/0126230 A1* | 5/2012 | Fournel | H01L 25/50 |
| | | | 257/48 |
| 2012/0133381 A1* | 5/2012 | Bruland | H01L 22/32 |
| | | | 324/754.03 |
| 2013/0001547 A1* | 1/2013 | Canegallo | H01L 22/34 |
| | | | 257/48 |
| 2014/0027933 A1 | 1/2014 | Zhang et al. | |
| 2018/0374864 A1 | 12/2018 | Fukuzumi et al. | |
| 2019/0081069 A1 | 3/2019 | Lu et al. | |

* cited by examiner

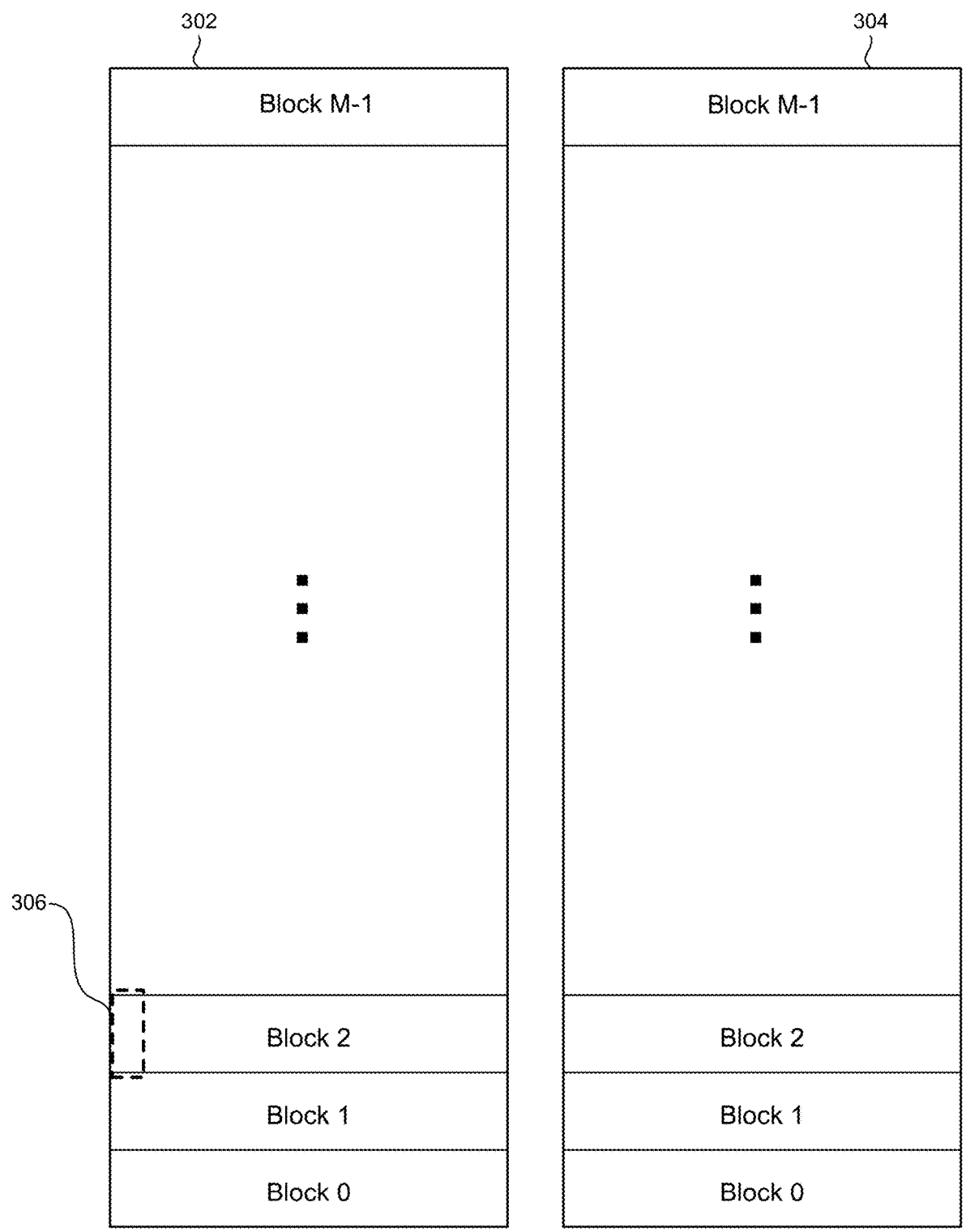

Figure 4D
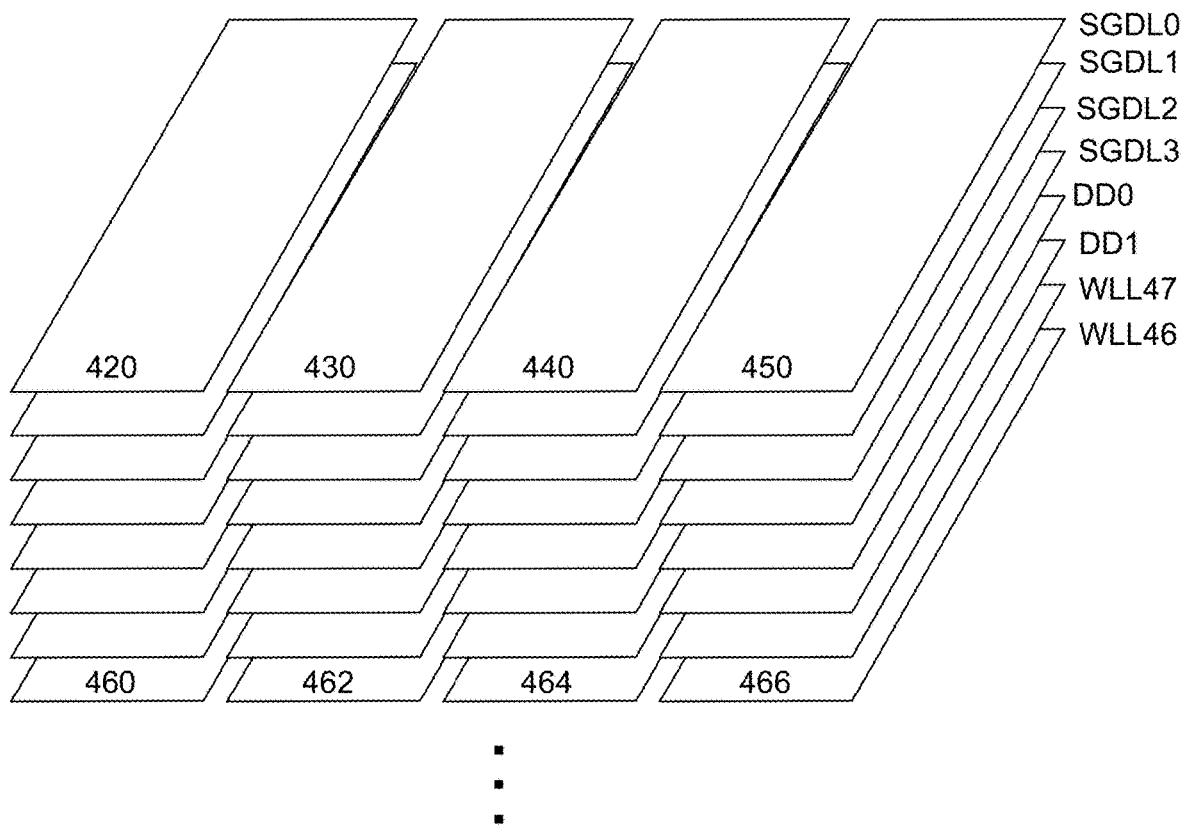
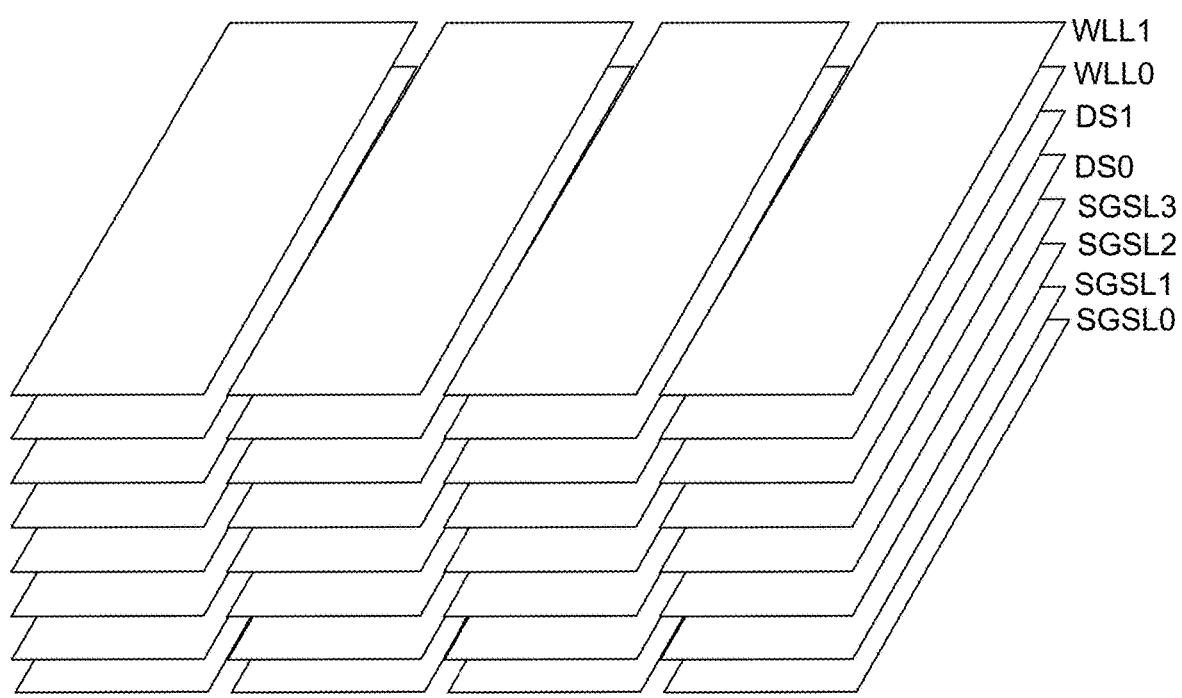

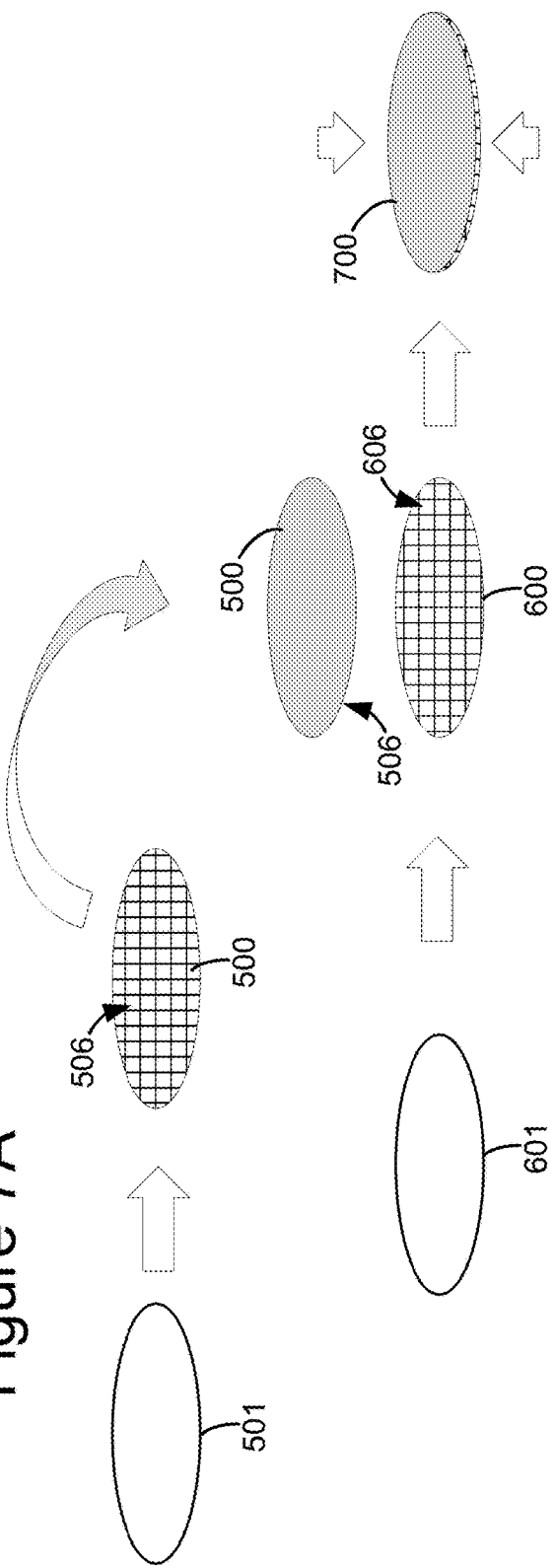
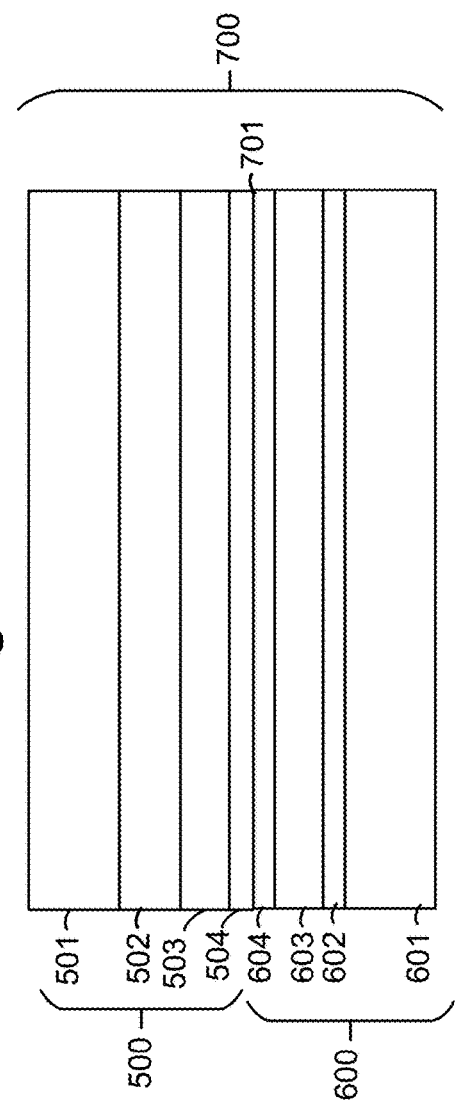

CONNECTIVITY DETECTION FOR WAFER-TO-WAFER ALIGNMENT AND BONDING

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

A non-volatile memory may be connected to control circuits that perform memory access operations such as read and write operations. Non-volatile memory may be provided in a semiconductor chip or die with control circuits provided on a separate chip or die. These chips may be physically connected by bonding pads to allow electrical coupling of circuits on respective chips.

BRIEF DESCRIPTION OF THE DRAWINGS

Like-numbered elements refer to common components in the different figures.

FIG. 4A is a block diagram of a memory structure having two planes.

FIG. 4D depicts a view of the select gate layers and word line layers.

FIGS. 7A-C illustrate wafer-to-wafer bonding and structures formed.

DETAILED DESCRIPTION

In some examples presented here, wafer-to-wafer bonding is used to bond opposing pads of two workpieces (e.g. to bond an array wafer containing memory arrays with a control circuits wafer containing control circuits) to form a combined workpiece. Pads of each array die of an array wafer may be bonded with corresponding pads of a corresponding control circuits wafer. Wafer-to-wafer bonding can provide a large number of individual connections between such dies. In order to form good connections, workpieces are aligned prior to bonding. After bonding, the bonded interface is hidden, and alignment is not easily determined. In some cases, alignment may vary across a workpiece so that some dies are aligned while other dies of the same workpiece are misaligned. Rapid detection of misalignment can provide feedback to allow alignment and/or bonding processes to be corrected rapidly, thereby reducing loss, and may allow early identification of bad components thereby saving testing time.

Electrical connectivity between pads of opposing workpieces that are wafer-to-wafer bonded may be detected and used to determine whether workpieces are aligned or misaligned. For example, test pads may be provided on opposing surfaces and a connectivity detection circuit may detect electrical connectivity through the test pads. Connectivity detection circuits may be provided on-chip in a workpiece to be bonded and an indicator of connectivity may be obtained from such circuits at the start of wafer-level testing to provide rapid feedback. An opposing workpiece may include passive components connected to test pads (e.g. test pads may be connected together by one or more conductive paths).

For example, connectivity detection circuits may be included in a control circuits workpiece and may be connected to test pads on the control circuits workpiece while corresponding test pads of an array workpiece are simply connected by a conductive path. This keeps implementation simple, for example, by using passive components in the array workpiece so that additional process steps may be unnecessary.

Figure 1:
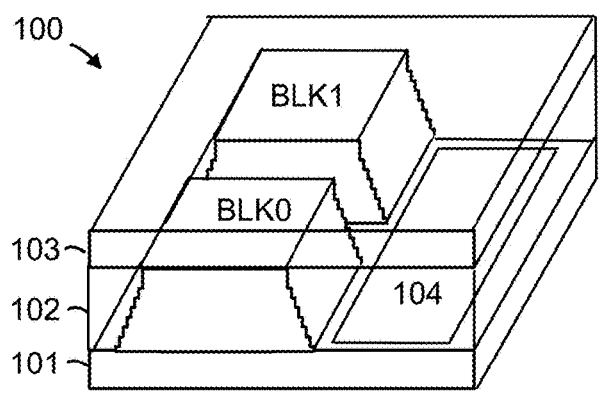
FIG. 1 is a perspective view of a 3D stacked non-volatile memory device.

FIGS. 1-4F describe one example of a memory system that can be used to implement the technology proposed herein. FIG. 1 is a perspective view of a three-dimensional (3D) stacked non-volatile memory device. The memory device 100 includes a substrate 101. On and above the substrate are example blocks of cells, including BLK0 and BLK1, formed of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block of cells comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
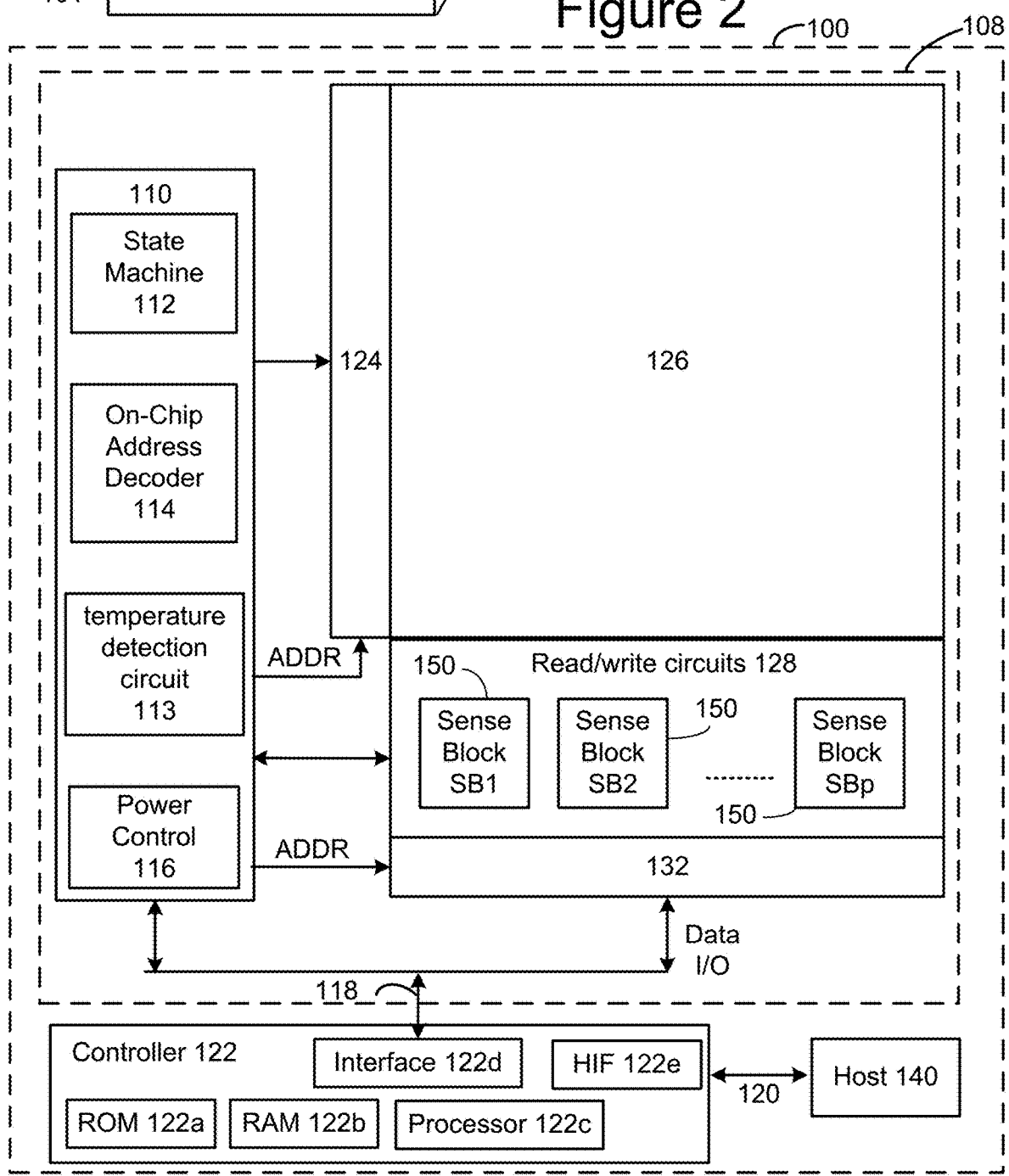
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three-dimensional memory structure 126 of memory cells (such as, for example, a 3D array of memory cells), control circuitry 110, and read/write circuits 128. In other embodiments, a two-dimensional array of memory cells can be used. Memory structure 126 is addressable by word lines via a decoder 124 (row decoder) and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device, such as memory device 100 (e.g., a removable storage card) as the one or more memory die 108. However, in other systems, the Controller can be separated from the memory die 108. In some embodiments, a Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three-dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The Controller 122 (which in one embodiment is an electrical circuit) may comprise one or more processors 122c, ROM 122a, RAM 122b, Memory Interface 122d and Host Interface 122e, all of which are interconnected. One or more processors 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively, or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d. Host Interface 122e in communication with ROM 122a, RAM 122b and processor 122c, is an electrical circuit that provides an electrical interface between Controller 122 and host 140. For example, Host Interface 122e can change the format or timing of signals, provide a buffer, isolate from surges, latch I/O, etc. Commands and data from host 140 are received by Controller 122 via Host Interface 122e. Data sent to host 140 are transmitted via Host Interface 122e.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
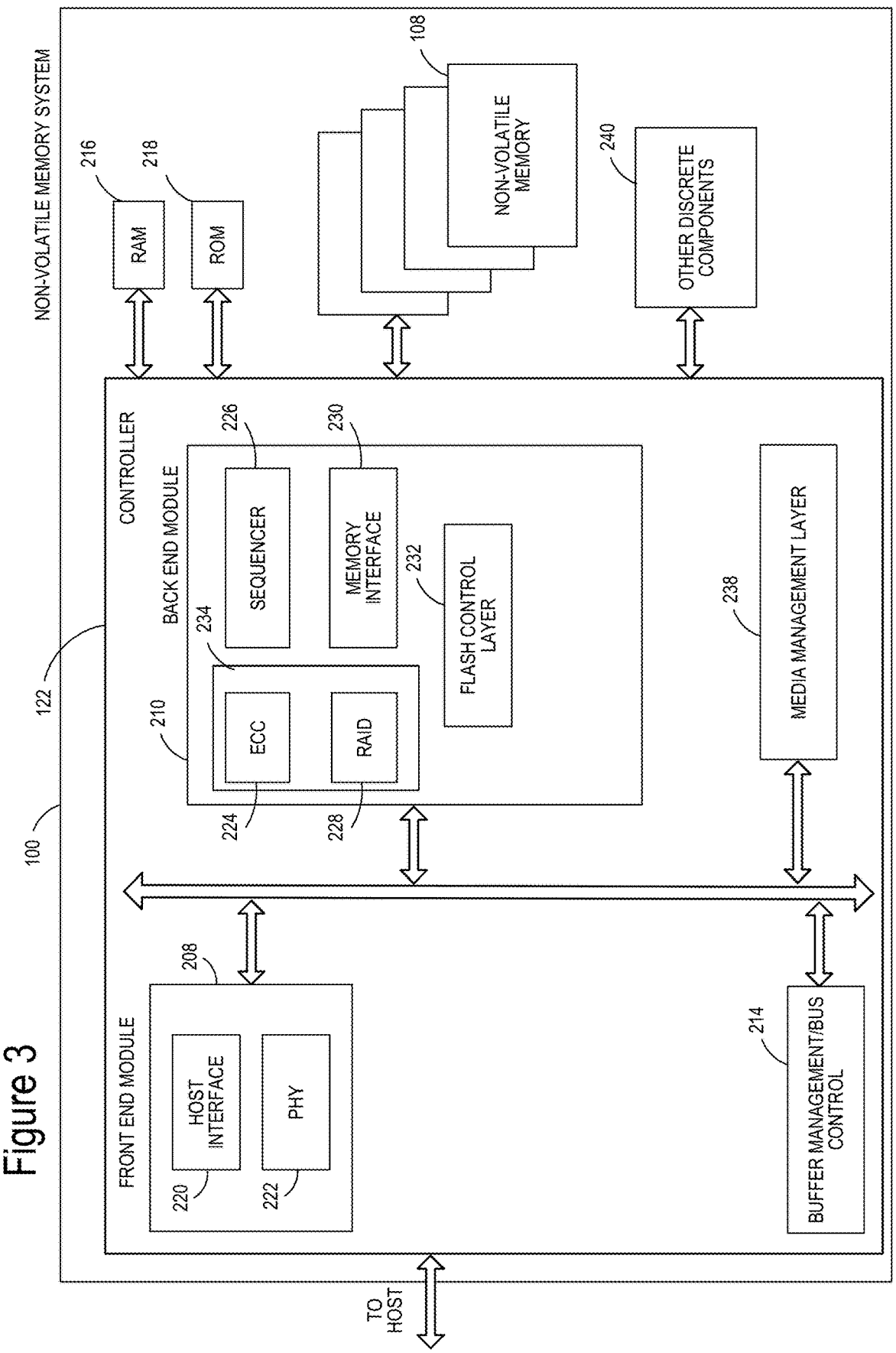
FIG. 3 is a block diagram depicting one embodiment of a Controller.

FIG. 3 is a block diagram of example memory system 100, depicting more details of Controller 122. In one embodiment, the system of FIG. 3 is a solid-state drive (SSD). As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The communication interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid-state disk (SSD) drive installed in a personal computer.

In some embodiments, memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 122 includes a front-end module 208 that interfaces with a host, a back-end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front-end module 208 includes a host interface 220 and a physical layer interface 222 (PHY) that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 may be a communication interface that facilitates transfer for data, control signals, and timing signals.

Back-end module 210 includes an error correction Controller (ECC) engine, ECC engine 224, that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. ECC engine 224 and RAID module 228 both calculate redundant data that can be used to recover when errors occur and may be considered examples of redundancy encoders. Together, ECC engine 224 and RAID module 228 may be considered to form a combined redundancy encoder 234. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of memory system 100 illustrated in FIG. 3 include media management layer 238, which performs wear leveling of memory cells of non-volatile memory die 108. Memory system 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of memory die 108. The MML 238 may be needed because: 1) the flash memory may have limited endurance; 2) the flash memory 126 may only be written in multiples of pages; and/or 3) the flash memory 126 may not be written unless it is erased as a block (i.e. a block may be considered to be a minimum unit of erase). The MML 238 understands these potential limitations of the flash memory 126 which may not be visible to the host. Accordingly, the MML 238 attempts to translate the writes from host into writes into the flash memory 126.

Controller 122 may interface with one or more memory die 108. In in one embodiment, Controller 122 and multiple memory dies (together comprising memory system 100) implement a solid-state drive (SSD), which can emulate, replace or be used instead of a hard disk drive inside a host, as a NAS device, etc. Additionally, the SSD need not be made to work as a hard drive.

Figure 4:
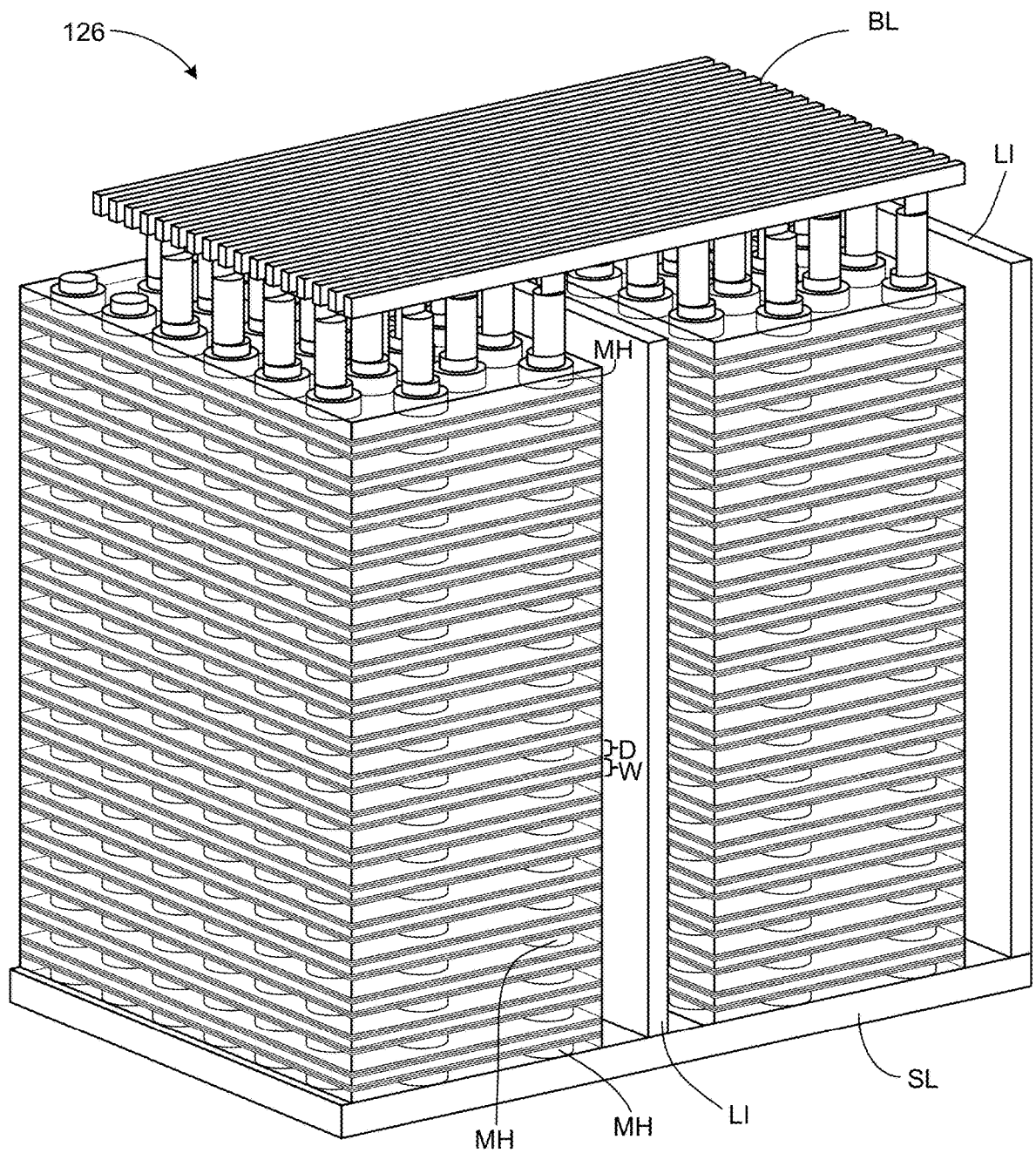
FIG. 4 is a perspective view of a portion of one embodiment of a three-dimensional monolithic memory structure.

FIG. 4 is a perspective view of a portion of a three-dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional memory structure 126 is provided below with respect to FIG. 4A-4F.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
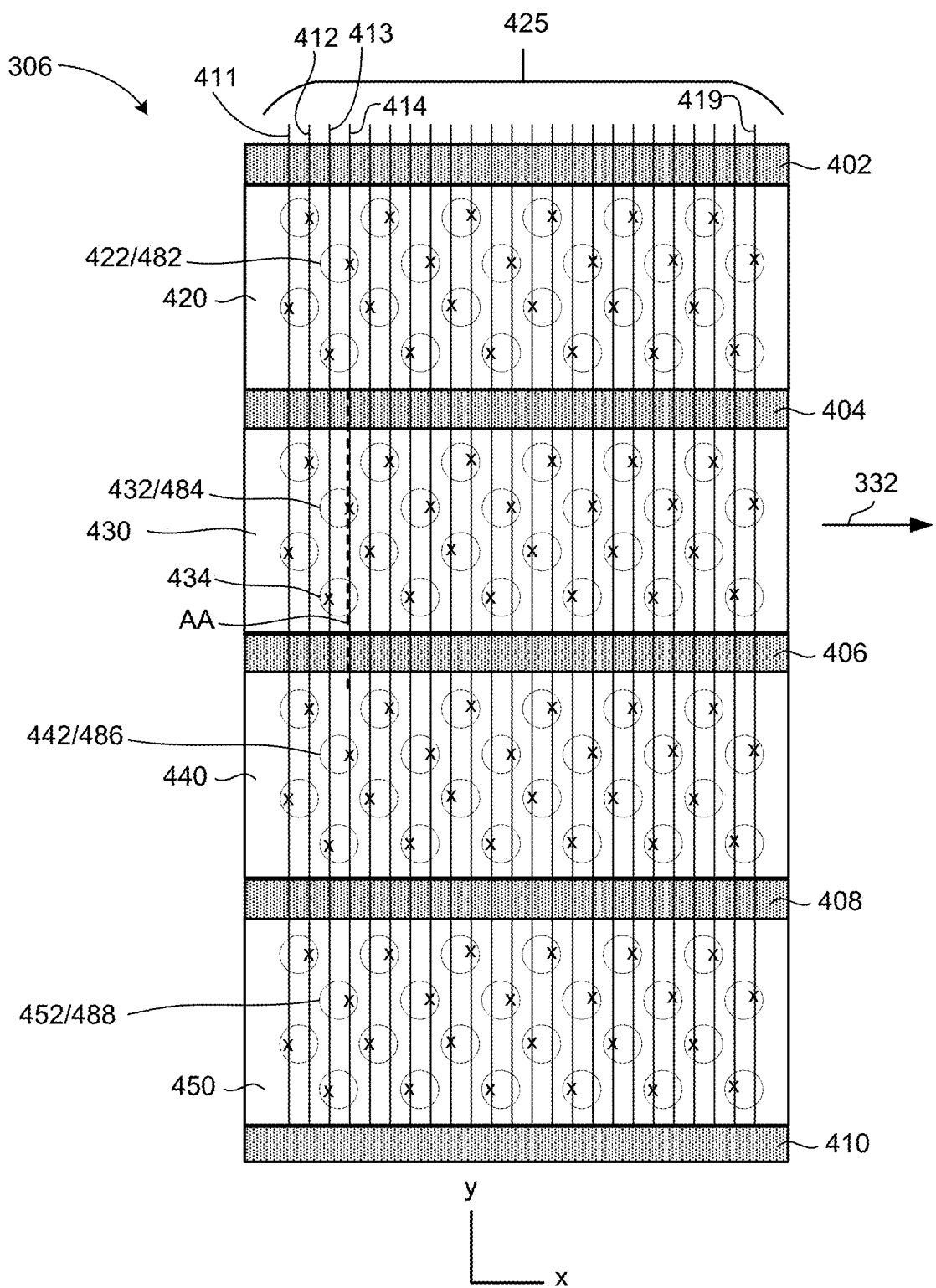
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 425, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
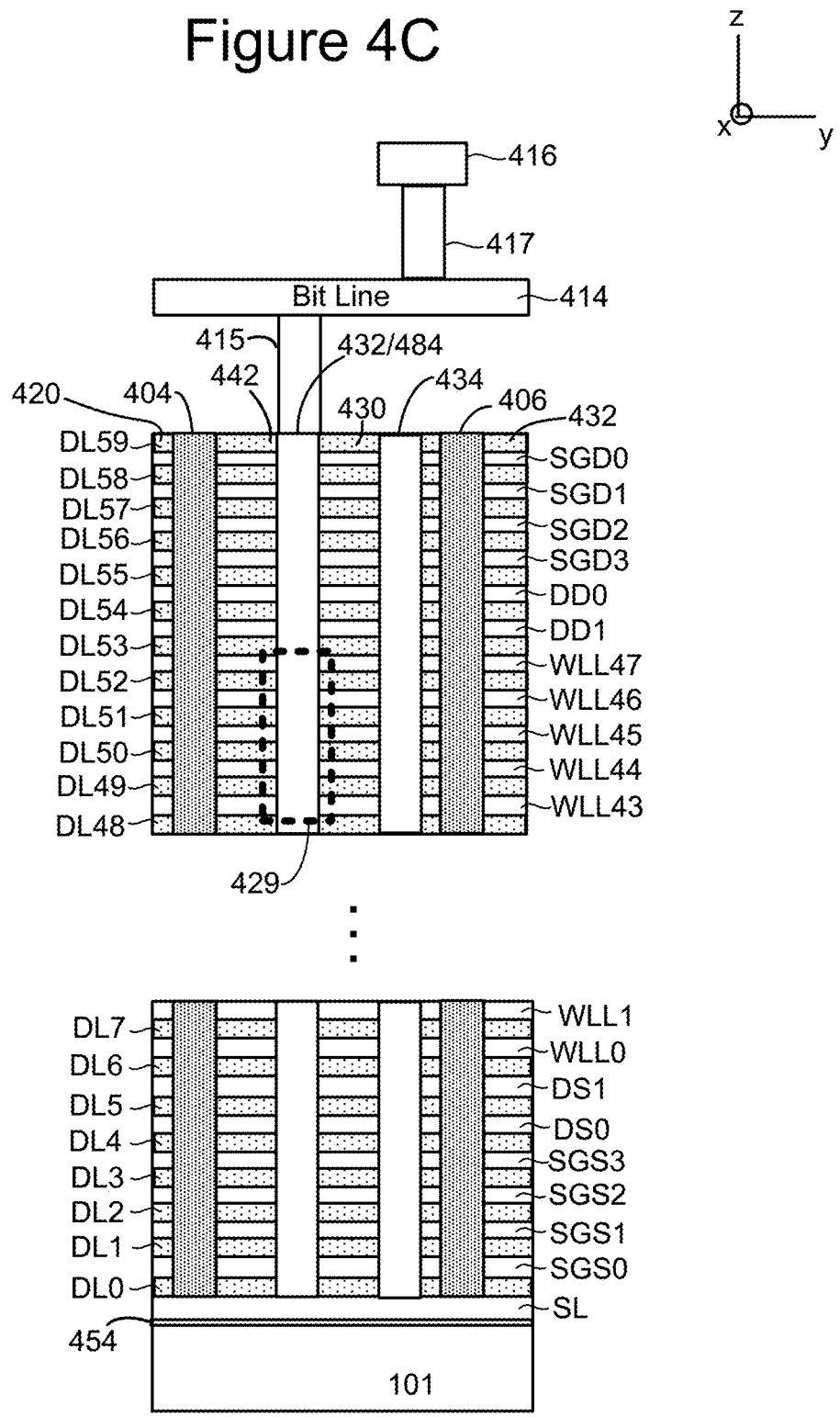
FIG. 4C depicts a cross sectional view of a portion of a block of memory cells.

FIG. 4C depicts a portion of an embodiment of three-dimensional memory structure 126 showing a cross-sectional view along line AA of FIG. 4B. This cross-sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty-eight data word line layers WLL0-WLL47 for connecting to data memory cells. Other embodiments can implement more or less than four drain side select layers, more or less than four source side select layers, more or less than four dummy word line layers, and more or less than forty-eight-word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit line 414 via connector 415. Local interconnects 404 and 406 are also depicted.

Bit line 414 is connected to pad 416 by via 417. Additional bit lines that are coupled to additional vertical columns are similarly connected. A number of bit lines may extend over such a memory structure and may connect to multiple blocks through block select circuits. Such bit lines are connected to pads that may be exposed along a top surface (primary surface) of a work piece so that they can be used to form electrical connection. Similarly, word lines (e.g. WLL0-WLL47), dummy word lines (e.g. DD0-1, DS0-1), and select lines (e.g. SGD0-SGD3) may be coupled by vias (not shown in FIG. 4C) to pads on the primary surface of a workpiece (e.g. pads that are co-planar with pad 416). For example, word line layers may be arranged in a stepped "staircase" arrangement in an outer area (outside area where memory cells are formed) so that each word line layer is exposed and can be contacted by a via.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment, local interconnects 402, 404, 406, 408 and 410 break up each conductive layer into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
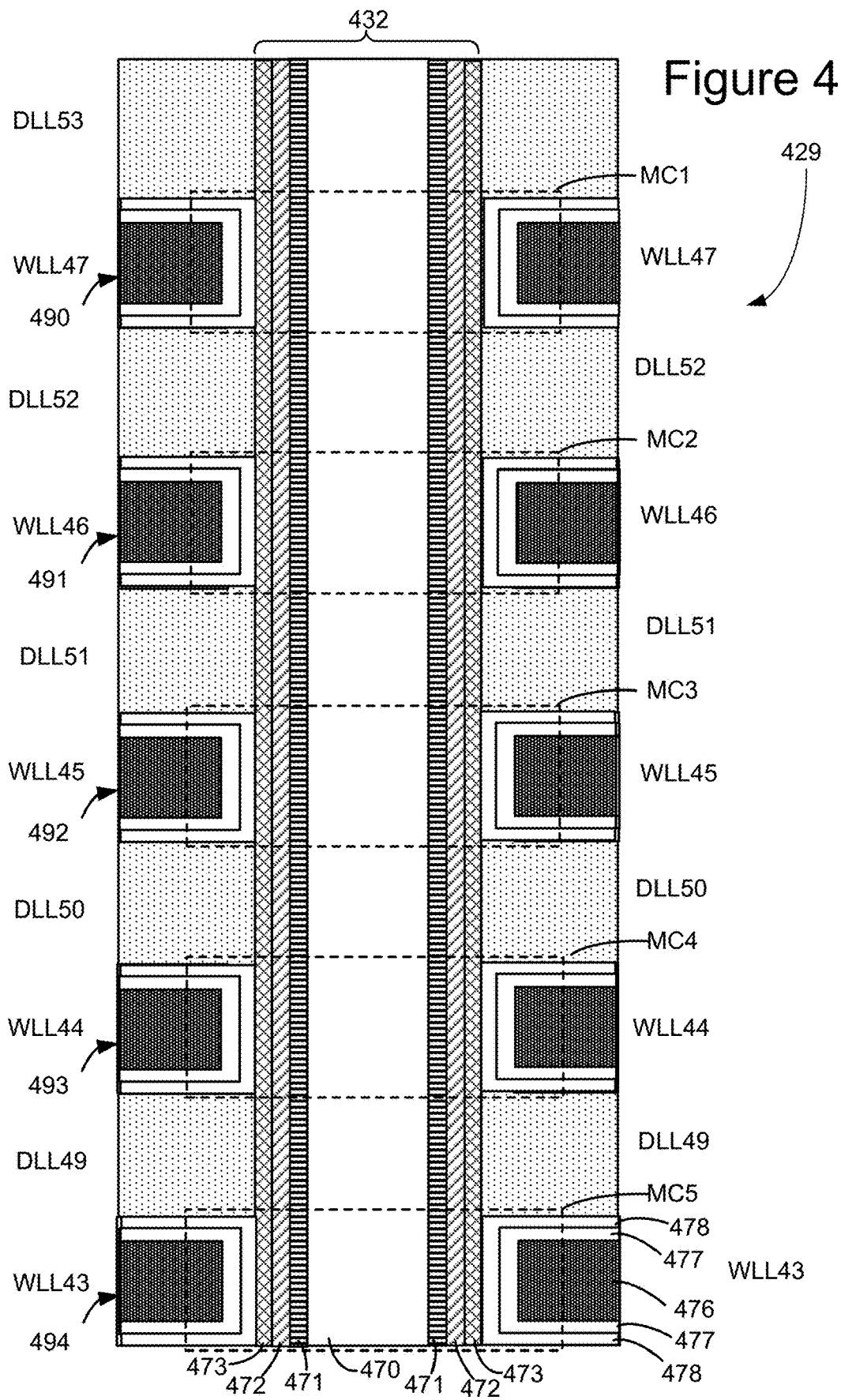
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core 470 that is made of a dielectric, such as $SiO_2$. Other materials can also be used. Surrounding inner core 470 is a polysilicon channel, channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide layer 478 ($SiO_2$). The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming a non-volatile storage system is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
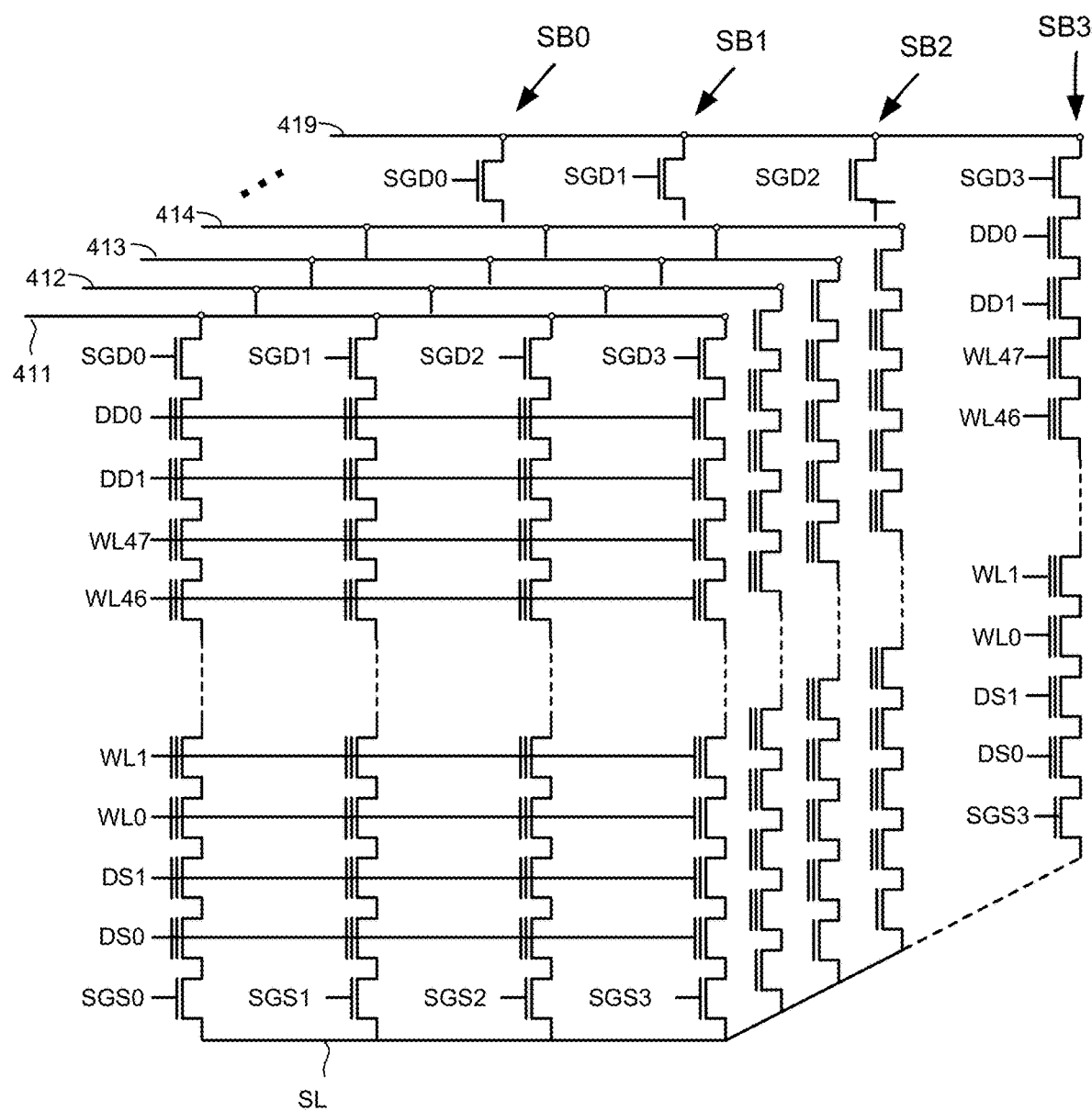
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three-dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming a non-volatile storage system, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

Figure 5A:
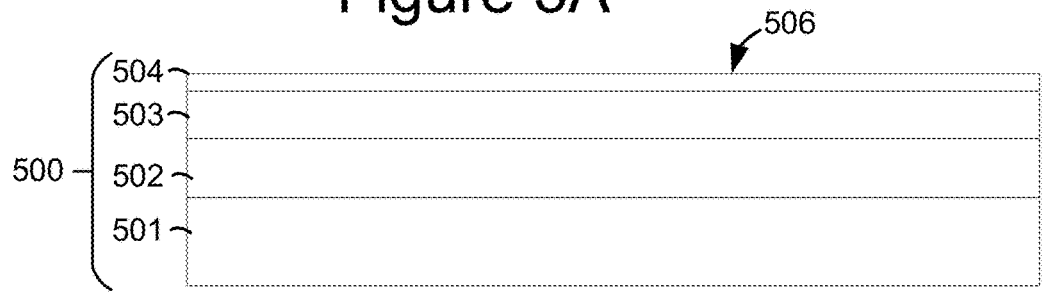
FIGS. 5A-B illustrate an array workpiece including pads for bonding.

FIG. 5A illustrates non-volatile memory such as memory structure 126 after interconnect and bonding features are formed. FIG. 5A shows a cross-section of a workpiece 500 that includes a substrate 501, for example, a silicon substrate such as a silicon wafer (e.g. 300 mm wafer) or a portion of a wafer. The term workpiece may refer to a substrate (e.g. wafer or portion of a wafer) and components formed in or on the substrate including electrical components such as active components, interconnect layers, dielectric layers, and bond pads. On and above substrate 501 is an intermediate region 502 that may include blocks of non-volatile memory cells (e.g. including BLK0 and BLK1 shown in FIG. 1, having memory structure 126 illustrated in FIGS. 4-4F). In an upper region 503 (interconnect region) of workpiece 500, one or more metal layers are patterned in conductive paths to carry electrical signals. These may include bit lines (e.g. bit line 414 of FIG. 4C) and vias. Patterned metal layers are separated by dielectric layers (e.g. silicon dioxide or other insulator) that provide electrical isolation. Above upper region 503 is bonding region 504 which includes bond pads (e.g. pad 416) that connect to the conductive paths of upper region 503 and/or components of intermediate region 502 and/or substrate 501, to provide for electrical coupling to non-volatile memory cells in intermediate region 502 through conductive traces of upper region 503. Bonding region 504 may include a dielectric layer with bond pads formed in or on the dielectric layer so that pads are exposed at surface 506 (primary surface) and can bond with opposing bond pads in a wafer-to-wafer bonding process.

Figure 5B:
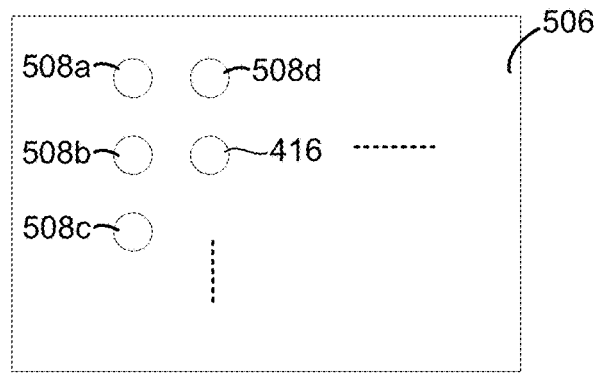

FIG. 5B shows a top-down view of a portion of primary surface 506 of workpiece 500 showing exposed pads including pads 508a-d (which may include active pads coupled to bit lines, word lines, dummy word lines, select gate lines, and test pads provided for test purposes) and 416 (previously shown in FIG. 4C). While a small number of pads are illustrated in this example, it will be understood that a large number of pads may be provided on the surface of a workpiece such as workpiece 500. An individual die may include, for example, millions of pads, with a wafer including hundreds or thousands of dies. Bonding region 504 may include a dielectric layer that extends about the pads and isolates neighboring pads. Pads may be made of a suitable electrical conductor such as copper or a copper alloy that contains copper, or other suitable metal or metal alloy.

Figure 6A:
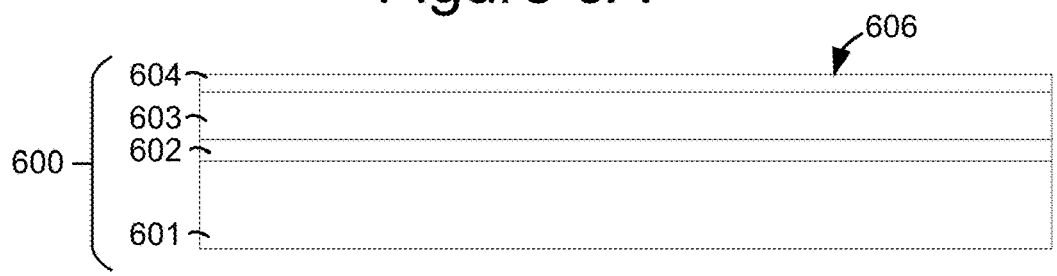
FIG. 6A-B illustrate a control circuit workpiece including pads for bonding.

FIG. 6A illustrates an example of a workpiece 600 containing control circuits such as control circuits of memory controller 122 illustrated in FIG. 3. Workpiece 600 includes substrate 601, for example a silicon wafer (e.g. 300 mm wafer) or a portion of a wafer. On and above substrate 601 is an intermediate region 602 that may include control circuits formed on (and/or in) substrate 601. For example, intermediate region may include CMOS (Complementary Metal-Oxide-Semiconductor) circuits including circuits of controller 122 that are formed in an active area of substrate 601. In an upper region 603 (interconnect region) of workpiece 600, one or more metal layers are patterned in conductive paths to carry electrical signals. These may include traces that extend laterally and vias that extend vertically with respect to a primary surface of the substrate. Such conductive paths form electrical connections between different circuits (e.g. connecting components of controller 122). Patterned metal layers are separated by dielectric layers (e.g. silicon dioxide or other insulator) that provide electrical isolation. Above upper region 603 is bonding region 604 which includes bond pads that connect to the conductive paths of upper region 603 and/or components of intermediate region 602 and/or substrate 601, to provide for electrical coupling to circuits in intermediate region 602 through conductive paths of upper region 603. Bonding region 604 may include a dielectric layer with bond pads formed in or on the dielectric layer so that they are exposed at surface 606 (primary surface) and can bond with opposing bond pads in a wafer-to-wafer bonding process.

Figure 6B:
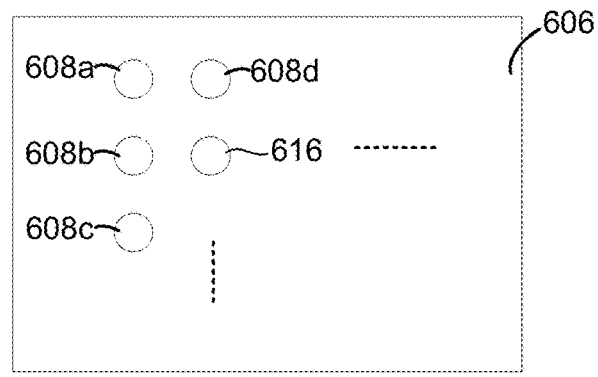

FIG. 6B shows a top-down view of a portion of primary surface 606 of workpiece 600 showing exposed pads including pads 608a-d (which may include active pads and test pads provided for test purposes) and pad 616. Bonding region 604 may include a dielectric layer that extends about the pads and isolates neighboring pads. Pads may be made of a suitable electrical conductor such as copper or a copper alloy that contains copper, or other suitable metal or metal alloy.

Pads 608a-d and 616 may be arranged to connect with corresponding pads of another workpiece for a wafer-to-wafer bonding process. For example, pad 616 may be located so that, when workpieces 500 and 600 are aligned and bonded, pad 616 bonds to pad 416 and thus bit line 414 may be controlled by control circuits in intermediate region 602 of workpiece 600. Workpiece 500 may include a number of memory dies and workpiece 600 may include an equal number of control circuit dies in a corresponding pattern (e.g. a one-to-one pattern so that for every memory die of workpiece 500 there is a corresponding control circuit die of workpiece 600). Opposing pairs of dies have corresponding patterns of pads so that, when workpieces are accurately aligned, each pad is aligned with a corresponding pad of an opposing die so that control circuits of workpiece 600 are electrically connected to memory cells of workpiece 500.

FIG. 7A illustrates the process of wafer-to-wafer bonding of workpiece 500 and workpiece 600. Substrate 501 is processed to fabricate memory arrays (e.g. memory structure 126), interconnect structures, and pads for bonding as discussed above with respect to FIGS. 5A-B, thereby forming workpiece 500. Substrate 601 is processed to fabricate control circuits (e.g. logic circuits formed as CMOS circuits), interconnect structures, and pads for bonding as discussed above with respect to FIGS. 6A-B, thereby forming workpiece 600. Workpiece 500 is then flipped over in this example (either workpiece may be flipped) so that primary surface 506 of workpiece 500 opposes primary surface 606 of workpiece 600. Workpieces 500, 600 are aligned so that corresponding dies are aligned in pairs and pads on such pairs of dies are aligned for bonding. Subsequently, with workpieces 500, 600 aligned, pressure and/or heat or other conditions are applied to workpieces 500, 600 to bond respective pads together and thus form electrical connections between memory arrays of workpiece 500 and control circuits of workpiece 600 (i.e. bonded along an interface between primary surfaces 506, 606). Bonded workpieces 500 and 600 form a combined workpiece 700 that includes pairs of dies, with each pair including a memory array die and a control circuit die that form a memory system. The combined workpiece or a portion of such a workpiece may be referred to as a CMOS bonded Array (CbA) and an individual chip formed in this way may be referred to as a CbA chip.

FIG. 7B illustrates combined workpiece 700 that includes workpiece 600 and workpiece 500. It can be seen that bonding region 504 of workpiece 500 is in contact with bonding region 604 of workpiece 600 along an interface 701 (i.e. interface between primary surfaces of workpieces 500, 600).

Figure 7C:
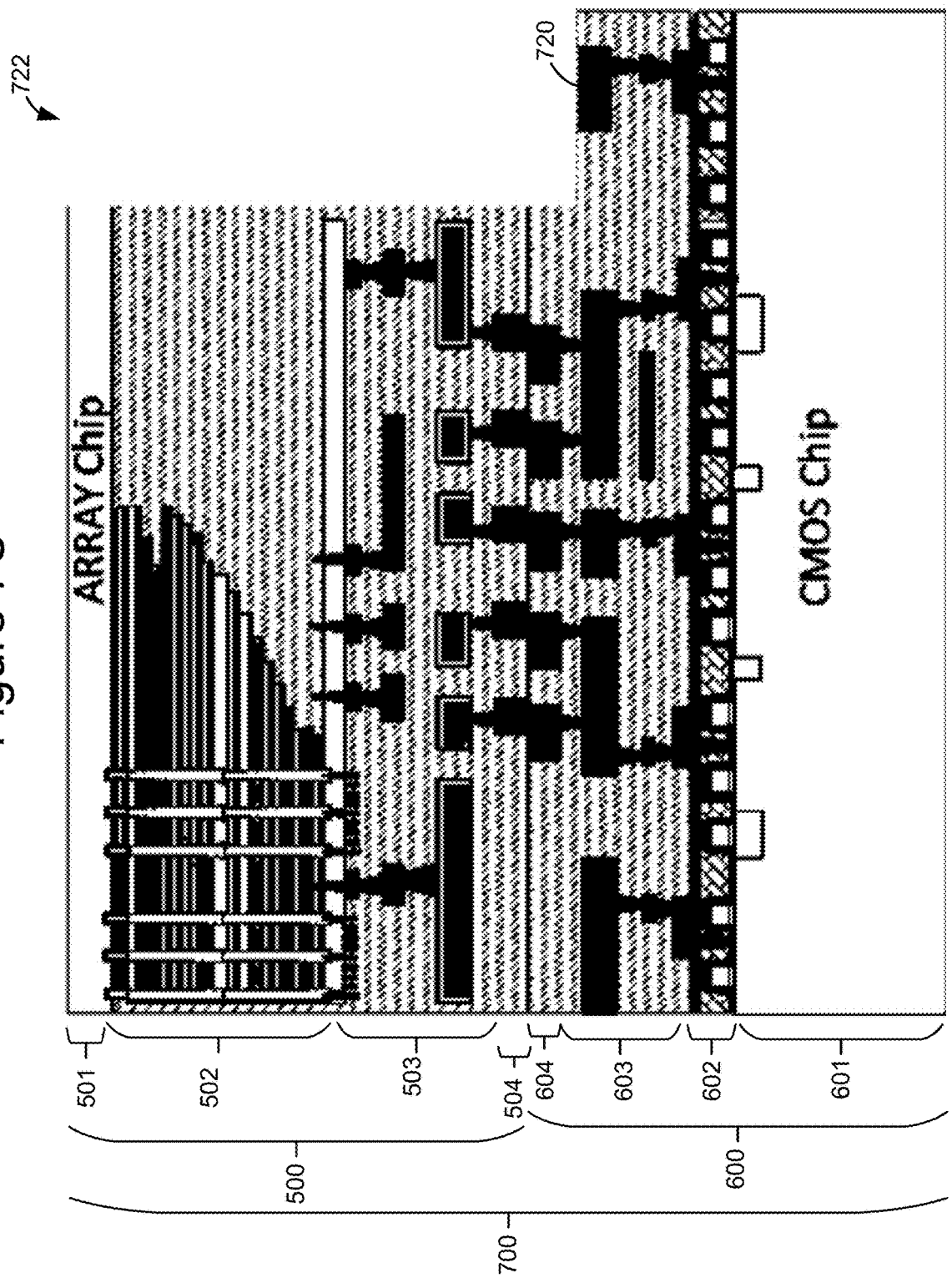

FIG. 7C shows a portion of combined workpiece 700 including substrate 601, intermediate region 602 (including active components formed as CMOS Chip components in and on substrate 601), upper region 603 (including conductive paths formed of traces and vias separated by dielectric), and bonding region 604 that includes pads bonded to corresponding pads of bonding region 504. Pads of bonding region 504 are coupled through conductive paths of upper region 503 to memory array elements in intermediate region 502, which was formed on substrate 501.

While pads along primary surfaces of workpieces 500, 600 may be bonded together and may not be exposed after bonding, additional pads may be provided for connection to other circuits (e.g. to circuits outside combined workpiece 700) and may be exposed for bonding and/or probing. Exposed pad 720 in workpiece 600 is exposed by an opening 722 that extends through workpiece 500. One or more such openings may be provided in each die of workpiece 500 so that designated pads of workpiece 600 remain exposed after wafer-to-wafer bonding of workpieces 500, 600. For example, openings may be etched through workpiece 500 before (or after) wafer-to-wafer bonding. While one exposed pad (pad 720) is shown, it will be understood that any number of exposed pads may be provided. For example, pads may be provided for interfacing with a host, receiving power, testing, and other purposes.

The fabrication process used to form workpiece 500 may be quite different to the fabrication process used to form workpiece 600. For example, while memory structure 126 of workpiece 500 includes a number of active regions above a substrate surface in a 3-D structure, logic circuits of workpiece 600 may be formed in a single active region. Logic circuits may be formed using a CMOS process while memory structure 126 uses process steps adapted to 3D memory fabrication, which may be different to CMOS process steps. Thus, the number of layers and the materials used may be different. Device dimensions and tolerances may also be different. And thermal budgets may be different. Inclusion of logic circuits in workpiece such as workpiece 500 may require additional process steps since the same process steps used to form memory structure 126 may not be compatible with forming logic circuits. Thus, logic circuits provided in a peripheral area (e.g. CMOS or other logic circuits in peripheral area 104) may be formed separately. This increases the number of process steps which increases risk of damage and creates thermal budget problems.

While FIG. 2 illustrates an example in which memory die 108 includes various circuits in addition to memory structure 126 (e.g. control circuitry 110, read/write circuits 128, and row decoder 124), which may be formed in a peripheral area (e.g. peripheral area 104 of FIG. 1) reducing or eliminating logic circuits from an array workpiece may reduce the number of process steps needed and reduce thermal budget problems. Wafer-to-wafer bonding provides relatively large areas for bonding large numbers of pads so that a wide interface may be provided between an array workpiece and a control circuit workpiece. This can facilitate a different arrangement of circuits to that shown in FIG. 2. For example, some or all of control circuitry 110, read/write circuits 128, and row decoder 124 that are shown on memory die 108 may be located on a control circuit workpiece in some examples instead of being located on the same die as memory structure 126. This may allow fabrication of an array workpiece that has few or no logic circuits (e.g. no CMOS components) so that fabrication can be significantly simplified and thermal budget concerns are reduced.

Figure 8:
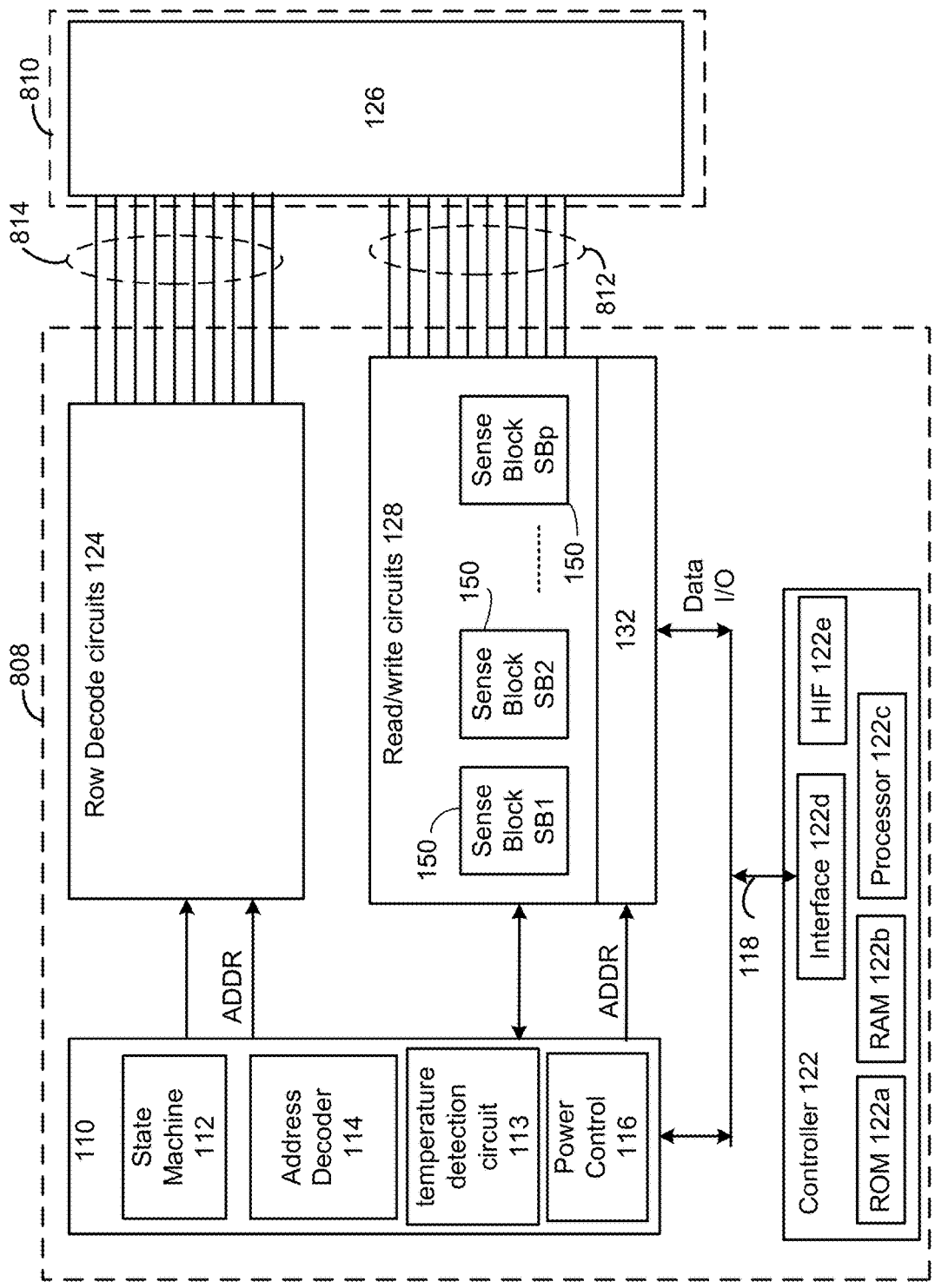
FIG. 8 illustrates an example of control circuits coupled to a memory structure through wafer-to-wafer bonding.

FIG. 8 shows an alternative arrangement to the arrangement of FIG. 2, which may be implemented using wafer-to-wafer bonding. FIG. 8 shows an example of control circuits formed in control circuit die 808 (e.g. a control circuit die in workpiece 600) coupled to memory structure 126 formed in array die 810 (e.g. an array die in workpiece 500). Common components are numbered as in FIG. 2. It can be seen that control circuitry 110, read/write circuits 128, and row decoder 124 (which may be formed by a CMOS process) are located in control circuit die 808. Controller 122 is also located in control circuit die 808. Control circuitry 110, read/write circuits 128, row decoder 124, and controller 122 may be formed by a common process (e.g. CMOS process) so that adding control circuitry 110, read/write circuits 128, and row decoder 124 to a die that includes controller 122 may require few or no additional process steps (i.e. the same process steps used to fabricate controller 122 may also be used to fabricate control circuitry 110, read/write circuits 128, and row decoder 124). Thus, while moving such circuits from a die such as memory die 108 may reduce the number of steps needed to fabricate such a die, adding such circuits to a die such as control circuit die 808 may not require any additional process steps.

FIG. 8 shows read/write circuits 128 coupled to memory structure 126 through electrical paths 812. For example, electrical paths 812 may provide electrical connection between read/write circuits 128 and bit lines of memory structure 126. Electrical paths may extend from read/write circuits 128 in control circuit die 808 through pads on control circuit die (e.g. pad 616) that are bonded to corresponding pads of array die 810 (e.g. pad 416), which are connected to bit lines of memory structure 126. Each bit line of memory structure 126 may have a corresponding electrical path in electrical paths 812, including a pair of bonded pads, that connects to read/write circuits 128. Similarly, row decoder circuits 124 are coupled to memory structure 126 through electrical paths 814. Each of electrical path 814 may correspond to a word line, dummy word line, or select gate line. Additional electrical paths may also be provided between control circuit die 808 and array die 810.

It will be understood that accurate alignment of pads between an array workpiece and a control circuits workpiece may be needed to form a functioning memory system. If pads are not aligned accurately, then no electrical connections or poor electrical connections are formed, and control circuits are unable to appropriately interact with memory cells. Misalignment of workpieces (e.g. workpieces 500, 600) may result in a combined workpiece (e.g. combined workpiece 700) being scrapped (i.e. all dies may be discarded), which represents a loss and is generally undesirable. In some cases, some dies may be aligned while other dies are misaligned (e.g. due to large forces and/or nonuniformity). Such die-level misalignment may not be immediately apparent. While testing may identify problems caused by misalignment, such testing may take significant time and alignment and/or bonding induced problems may persist while testing is performed until misalignment is identified as the origin and the problem is fixed. Significant loss may occur during such a time period before the problem is identified and fixed. In an arrangement such as illustrated in FIG. 8, with a large number of bonded connections to accommodate a non-volatile memory array, pads may be small and the potential for misalignment is great. Accordingly, misalignment may be of concern in such designs.

Aspects of the present technology allow misalignment of workpieces that are bonded by wafer-to-wafer bonding, including die-level misalignment, to be rapidly identified so that appropriate action can be taken. Misalignment may be detected using simple on-die circuits to give die-by-die information about alignment. This can be done prior to dicing of combined wafers into individual dies (e.g. immediately after, or soon after wafer-to-wafer bonding) so that results are available rapidly and any process-induced problems may be rapidly addressed. This may reduce the number of scrapped dies by allowing faster identification of misalignment problems and thus faster corrective action.

An example technique includes providing opposing pairs of test pads on surfaces that are to be wafer-to-wafer bonded (e.g. on surfaces 506, 606) with pads on one workpiece electrically connected together. Electrical connectivity between the opposing pads is then checked. If the pads are bonded appropriately, then electrical connectivity is good. If pads are not bonded (e.g. due to misalignment) then electrical connectivity may be poor (e.g. open circuit).

Figure 9A:
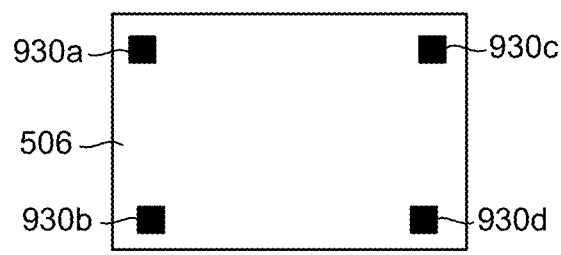
FIGS. 9A-E illustrate examples of structures used for electrical connectivity detection.

FIG. 9A illustrates test pads 930a-d provided on surface 506 of array workpiece 500. Test pads 930a-d may be distributed in any suitable manner. For example, test pads may be located at or near corners of a die or may be relatively close together at a particular location in a die. Each die may have one or more group of test pads, with two or more test pads per group. This allows alignment to be tested on a die-by die basis.

Figure 9B:
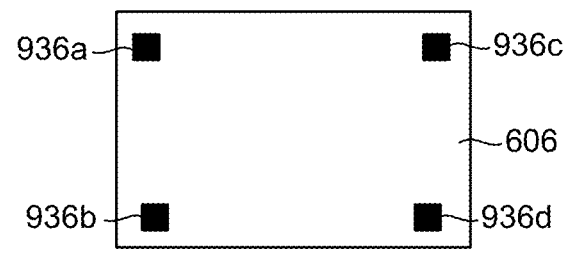

FIG. 9B illustrates test pads 936a-d provided on surface 606 of control circuits workpiece 600. Test pads 936a-d may be arranged to correspond to test pads 930a-d (i.e. test pads are laid out so that when surfaces 506, 606 are subject to wafer-to-wafer bonding, test pads 930a-d should align with test pads 936a-d.

Figure 9C:
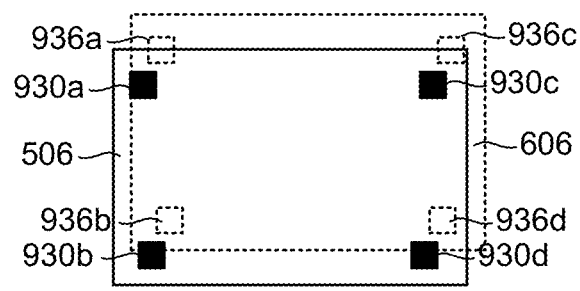

FIG. 9C illustrates misalignment of test pads 930a-d and test pads 936a-d. While test pad 930a is designed to align with test pad 936a and thus make an electrical connection, test pads 930a and 936a are misaligned and therefore do not overlap and are not bonded together during bonding. Similarly, test pads 930b and 936b do not overlap and are not bonded, test pads 930c and 936c do not overlap and are not bonded, and test pads 930d and 936d do not overlap and are not bonded. The example of misalignment shown involves no overlap and no bonding between opposing pads. Aspects of the present technology may be used to detect misalignment where there is no overlap as shown, or when there is some overlap and/or some bonding and is not limited to the case illustrated.

Figure 9D:
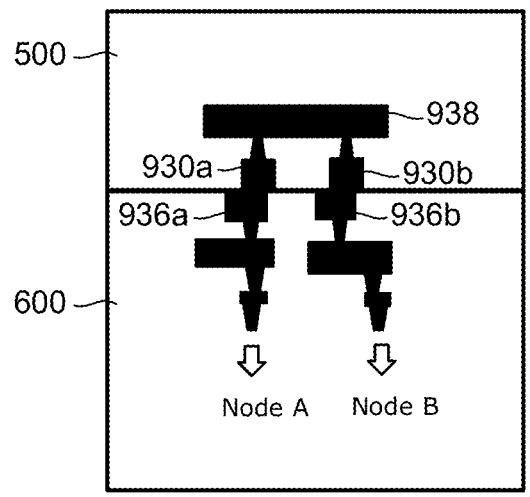

FIG. 9D illustrates a cross-sectional view of a portion of workpiece 500 containing test pads 930a-b and a portion of workpiece 600 containing test pads 936a-b. Test pad 930a is electrically connected to test pad 930b through conductive path 938 (e.g. through a metal trace and vias connecting test pads 930a-b to the trace). FIG. 9D shows the situation where the portions of workpieces 500, 600 are aligned and thus test pads are bonded and make electrical connections. Specifically, test pad 930a is bonded to test pad 936a and test pad 930b is bonded to test pad 936b. Test pad 936 is connected through a conductive pathway to Node A and test pad 936b is connected through another conductive pathway to Node B. Nodes A and B may be located in workpiece 600 and may be connected to appropriate connectivity detection circuits (e.g. circuits configured to test electrical connectivity that are formed in the control circuits of workpiece 600 or elsewhere) so that electrical connectivity between Node A and Node B can be tested. With alignment of test pads as shown, it can be seen that Node A is electrically connected to Node B because test pad 936a is connected to test pad 936b through opposing test pads 930a-b and conductive path 938. Thus, testing electrical connectivity of this structure would find good connectivity (i.e. there is low resistance between Nodes A and B and electrical current can flow between Node A and Node B with little voltage drop so that both Nodes A and B are at about the same voltage).

Figure 9E:
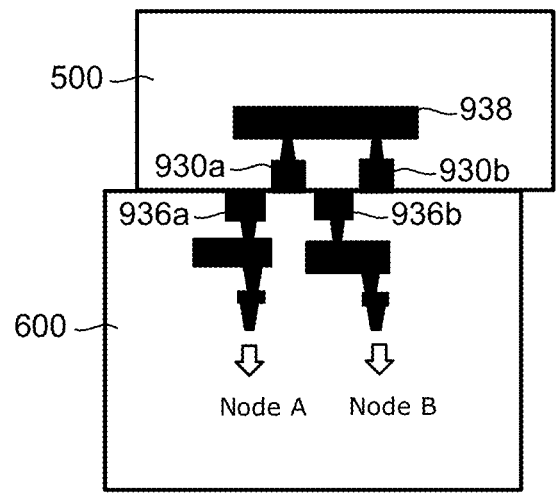

FIG. 9E illustrates misalignment of the portions of workpieces 500, 600 shown so that test pad 930a is not bonded to test pad 936a and test pad 930b is not bonded to test pad 936b (e.g. as in FIG. 9C). Because these test pads are not bonded, there is little or no electrical connectivity between test pad 936a and test pad 936b. Therefore, when electrical connectivity is measured between Node A and Node B, electrical connectivity will be bad (e.g. high electrical resistance indicating open condition so that nodes may be at different voltages), which indicates misalignment of test pads and thus misalignment of at least some portions of workpieces 500, 600. Connectivity between two such nodes may be rapidly detected in a number of ways so that misalignment may be rapidly identified and appropriate action may be taken.

In one arrangement, connectivity detection circuits are located in workpiece 600 (control circuit workpiece) and may be formed as CMOS logic circuits using the same process used to form control circuits while the components shown in workpiece 500 (array workpiece), including test pads 930a, 930b, and conductive path 938 are passive components that may be formed using the same process steps used to form conductive paths of workpiece 500. One or more of Nodes A and B may alternatively be located off-chip or may connect to off-chip components so that some or all connectivity detection circuits may be located outside workpiece 600 (e.g. external test equipment).

Figure 10A:
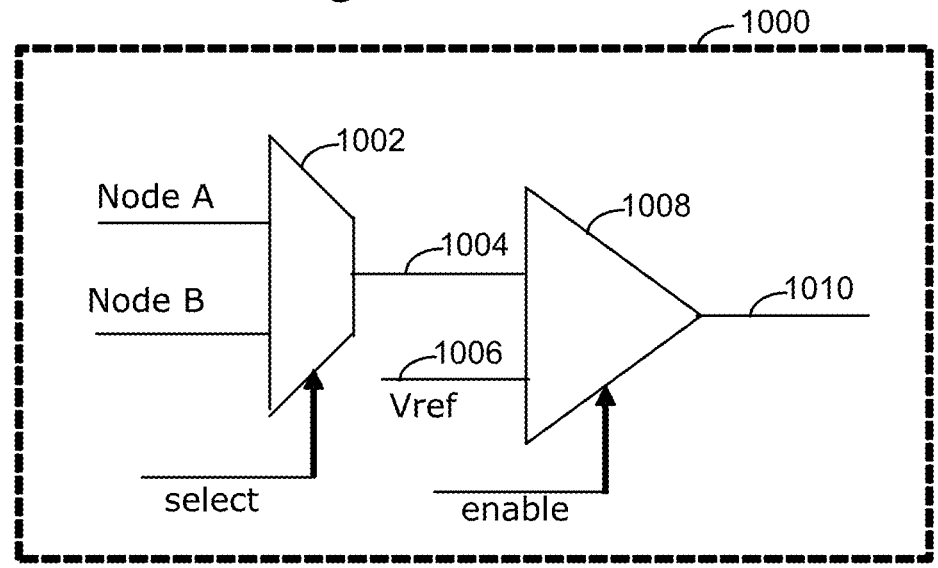
FIGS. 10A-B illustrate examples of connectivity detection circuits using a comparator.

FIG. 10A shows a first example of a connectivity detection circuit 1000, which may be coupled to Node A and Node B of FIGS. 9D-E to test the electrical connectivity between Nodes A and B. Inputs from Nodes A and B are provided to a Multiplexer 1002 (MUX), which selects (according to a select signal) one of the inputs and provides it on output 1004. Output 1004 from multiplexer 1002 is provided as an input signal to a comparator 1008, which receives a second input 1006 with a reference voltage, Vref. When enabled (according to an enable signal), comparator 1008 provides an output 1010 (a flag in this example) that indicates whether the voltage on the selected node (either Node A or B) is greater than voltage Vref. Thus, the voltages on either or both nodes may be compared with a reference voltage to see if both nodes are at a voltage that indicates electrical connectivity. For example, a voltage greater than Vref may be applied to conductive path 938 (through one of Node A or B, or otherwise) so that both Node A and Node B would have a voltage greater than Vref if they are electrically connected to conductive path 938. Both nodes may be checked (e.g. selected in series) to determine whether test pads 936a-b are aligned with test pads 930a-b and thus whether the portions of workpieces 500, 600 containing the test pads are aligned. If either node shows a voltage that is less than reference voltage Vref, this indicates that there is no connectivity and that test pads are not aligned (thus, the portions of workpieces 500, 600 are not aligned).

Figure 10B:
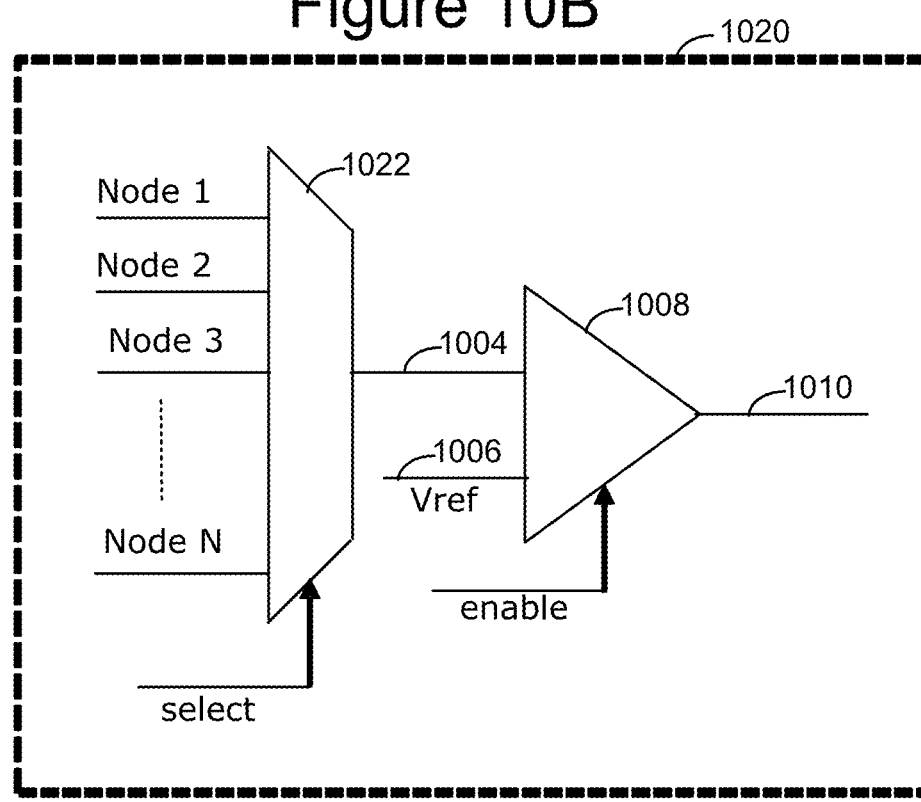

While two nodes are illustrated in the example of FIGS. 9D-E and in FIG. 10A, it will be understood that aspects of the present technology may be applied to any number of nodes connected to respective test pads (e.g. four nodes connected to the four test pads of FIG. 9B). FIG. 10B shows an example of a connectivity detection circuit 1020 that may be used to check electrical connectivity of N nodes (where N may be any number), each node coupled to a respective test pad (e.g. N=4 with each node coupled to one of test pads 936a-d of FIG. 9B). Connectivity detection circuit 1020 includes components similar to components of connectivity detection circuit 1000 and similar components are similarly numbered. A multiplexer 1022 is an N-input multiplexer so that the voltage from any one of N nodes may be selected and provided on output 1004 as an input of comparator 1008. N test pads may be arranged in a pattern to detect electrical connectivity at various locations in a combined workpiece (e.g. at different locations in each die.

Figure 11A:
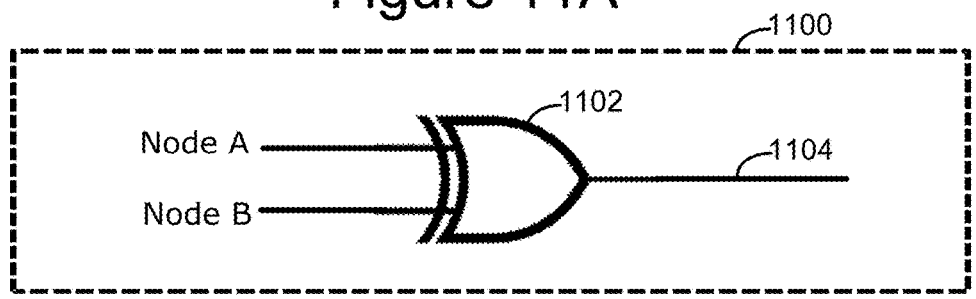
FIGS. 11A-B illustrate examples of connectivity detection circuits using an XOR gate.

FIG. 11A illustrates an example of a connectivity detection circuit 1100 that includes an Exclusive OR (XOR) gate 1102 that is coupled to Node A and Node B. The output 1104 may indicate if there is a difference between voltages at Node A and Node B (i.e. if both nodes are at a high voltage, or both at a low voltage, then the XOR condition is not satisfied and output 1104 may provide a logic low signal, and if one node is at a high voltage and the other is at a low voltage then the XOR condition is satisfied and output 1104 may provide a logic high signal). Thus, a logic low signal may indicate good electrical connectivity between Node A and Node B, while a logic high signal may indicate poor electrical connectivity between Node A and Node B, which further indicates poor alignment of portions of workpieces 500, 600.

Figure 11B:
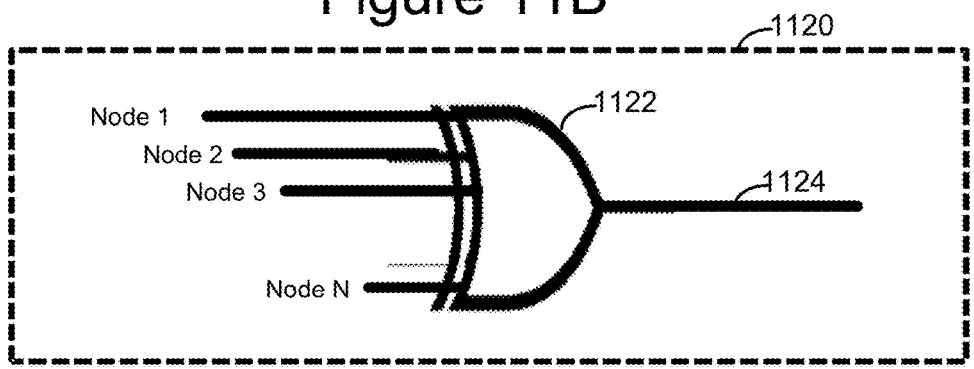

FIG. 11B illustrates an example of a connectivity detection circuit 1120 that includes an XOR gate 1122, which, in this example, is an N-input XOR gate so that voltages at N nodes can be compared (where N can be any number, e.g. four, or more). All nodes may be connected together by design (e.g. through wafer-to-wafer bonding with opposing test pads that are directly connected) so that all nodes should be at the same voltage if test pads are bonded together (e.g. should be at the voltage of conductive path 938). If one or more nodes are not at the same voltage, this indicates poor conductivity, which in turn indicates misalignment of one or more pairs of test pads. Thus, output 1124 may provide a logic low signal when all nodes are at the same level and may provide a high logic signal when one or more nodes are at a different level.

Figure 12A:
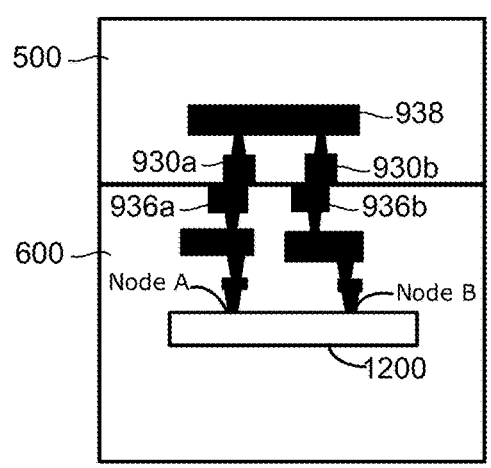
FIGS. 12A-B illustrate on-chip connectivity detection circuits in an array workpiece.

Connectivity detection circuits (e.g. connectivity detection circuits 1000, 1020, 1100, 1120 above) may be implemented in a workpiece as illustrated in cross-section in FIG. 12A, which shows connectivity detection circuits 1200 located in workpiece 600 (e.g. formed of CMOS logic components in an active layer in workpiece 600). While in this example, connectivity detection circuits 1200 are formed directly under corresponding test pads 363a-b, it will be understood that the location of connectivity detection circuits is not limited to such a location.

Figure 12B:
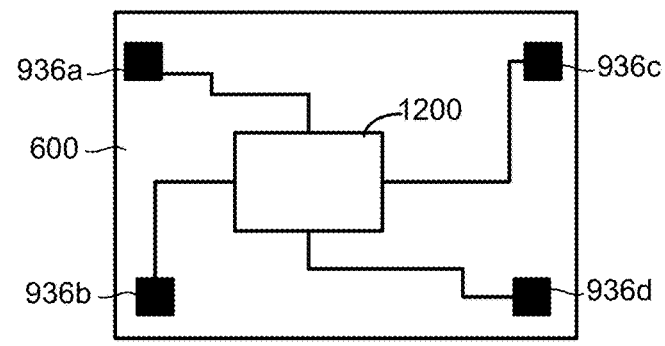

FIG. 12B shows another illustration of location of connectivity detection circuits 1200 with respect to test pads 363a-d in a portion of workpiece 600. In this example, connectivity detection circuits 1200 are coupled to test pads 363a-d through conductive paths so that the distribution of test pads is not limited to an area over connectivity detection circuits. For example, test pads may be distributed at different locations about a die, with each die in a wafer having a pattern of test pads to test alignment on a die-by-die basis.

Figure 13A:
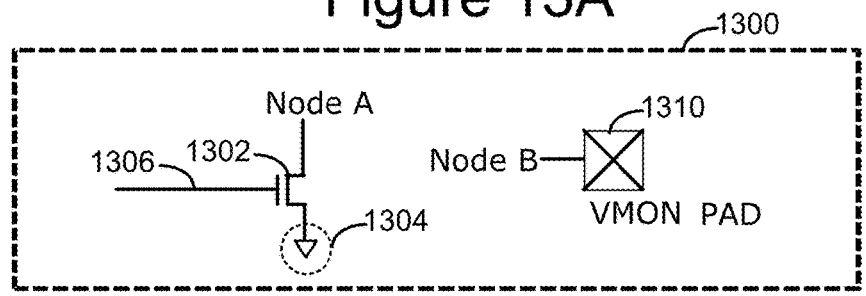
FIGS. 13A-D illustrate connectivity detection using on-chip components and off-chip components.

While the above examples show connectivity detection circuits located on-chip, at least some portion of connectivity detection circuits may be formed off-chip. After wafer-to-wafer bonding (e.g. after process illustrated in FIG. 7A) a combined workpiece (e.g. combined workpiece 700) may be subject to some wafer-level testing (i.e. testing before a combined wafer is diced into individual dies). FIG. 13A illustrates an example of certain connectivity detection circuit components 1300 that are formed on-chip (e.g. in workpiece 600) and may be used with off-chip components (e.g. external testing equipment) to detect connectivity between Node A and Node B. FIG. 13A shows that Node A is connected through a switch 1302 (shown as a transistor) to a current sink 1304, which in this case is a ground connection. Switch 1302 is controlled by input 1306 (e.g. controlled by voltage applied to the gate of a transistor) to selectively connect Node A to current sink 1304. Node B is connected to an exposed pad 1310 (voltage monitoring pad "VMON PAD"). Exposed pad 1310 may be a pad formed on workpiece 600 that, after wafer-to-wafer bonding, is exposed and can be probed during testing (e.g. similar to exposed pad 720 that is exposed through opening 722). When suitable external equipment is connected to exposed pad 1310, the external equipment in combination with components 1300 may detect connectivity between Node A and Node B and thus determine alignment/misalignment of at least a portion of a combined workpiece. Examples of alignment/misalignment using external equipment is illustrated in FIGS. 13B-D.

Figure 13B:
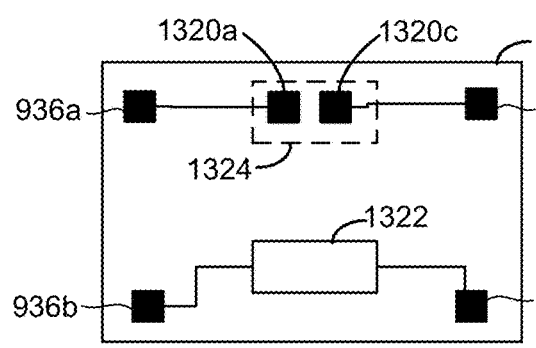

FIG. 13B illustrates an example in which test pads 936a and 936c of workpiece 600 (control circuit workpiece) are coupled to exposed pads 1320a, 1320c, while test pads 936b and 936d are coupled to on-chip components 1322. Area 1324, which includes exposed pads 1320a, 1320c, is designed to align with an opening in a corresponding workpiece during wafer-to-wafer bonding so that exposed pads 1320a, 1320c remain exposed after wafer-to-wafer bonding and can be used for wafer-level testing. On-chip components 1322 may include, for example, a connection to a current sink (e.g. switch 1302 and current sink 1304 of FIG. 13A) or a voltage source (e.g. to provide a predetermined voltage to test pads 936b, 936d).

Figure 13C:
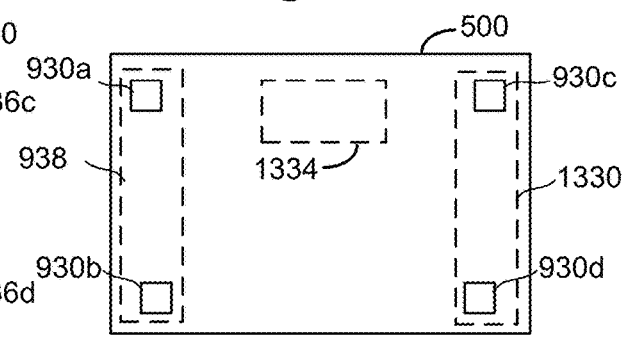

FIG. 13C illustrates features of workpiece 500 (array workpiece) including test pads 930a-d and conductive path 938 connecting test pads 930a and 930b (shown in cross section in FIGS. 9D-E). Conductive path 1330 similarly connects test pads 930c and 930d so that these test pads are similarly connected together. Opening 1334 extends through workpiece 500 so that, after wafer-to-wafer bonding, pads on workpiece 600, such as exposed pads 1320a, 1320c remain exposed. Thus, opening 1334 is designed to align with area 1324 of workpiece 600.

Figure 13D:
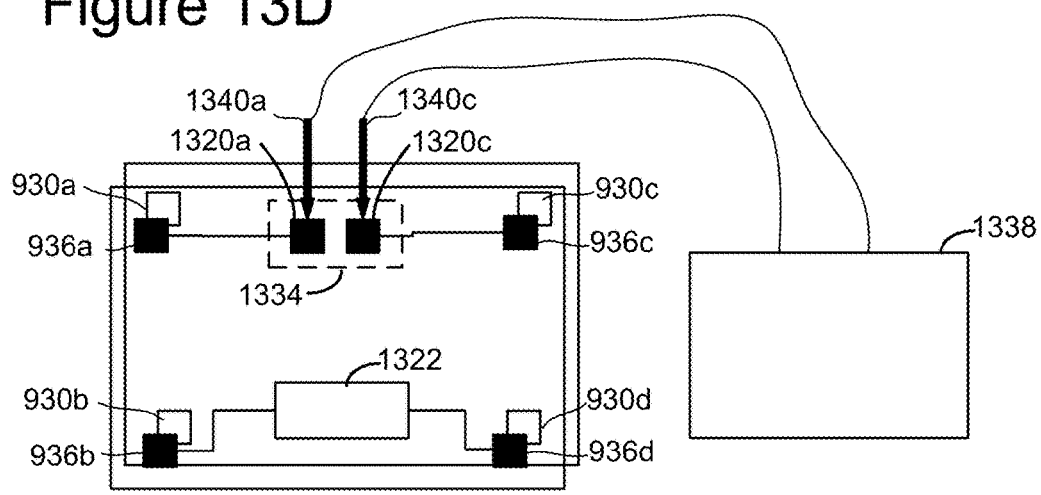

FIG. 13D illustrates testing after wafer-to-wafer bonding of workpieces 500, 600, with exposed pads 1320a, 1320c exposed through opening 1334 in workpiece 500. Probes 1340a, 1340c, which are coupled to external test equipment 1338 are placed in contact with exposed pads 1320a, 1320c. For example, where on-chip components 1322 are configured to sink current (e.g. current sink 1304), external test equipment 1338 may be configured to provide current to probes 1340a and 1340c and measure the current that flows (i.e. may include a current source and a current meter coupled to probes). If the current flowing through a given probe is less than a threshold current, this indicates poor electrical connectivity between test pads. For example, if current flow through probe 1340a is less than the threshold current, this indicates poor connectivity between test pads 936a and 936b (which is coupled to a current sink in on-chip components 1322), which indicates misalignment of these test pads with corresponding test pads 930a, 930b. Where on-chip components 1322 are configured to provide a predetermined voltage to test pads 936b, 936d, external test equipment may detect voltage (e.g. comparing voltage with a reference voltage using components similar to those illustrated for on-chip use in FIGS. 10A-11B). It will be understood that where connectivity detection circuits are provided on-chip (e.g. in workpiece 600) an indication of alignment/misalignment may be provided through exposed pads to external test equipment as part of wafer-level testing (e.g. a one-bit aligned/misaligned indicator may be provided for each die of a combined workpiece).

Figure 14:
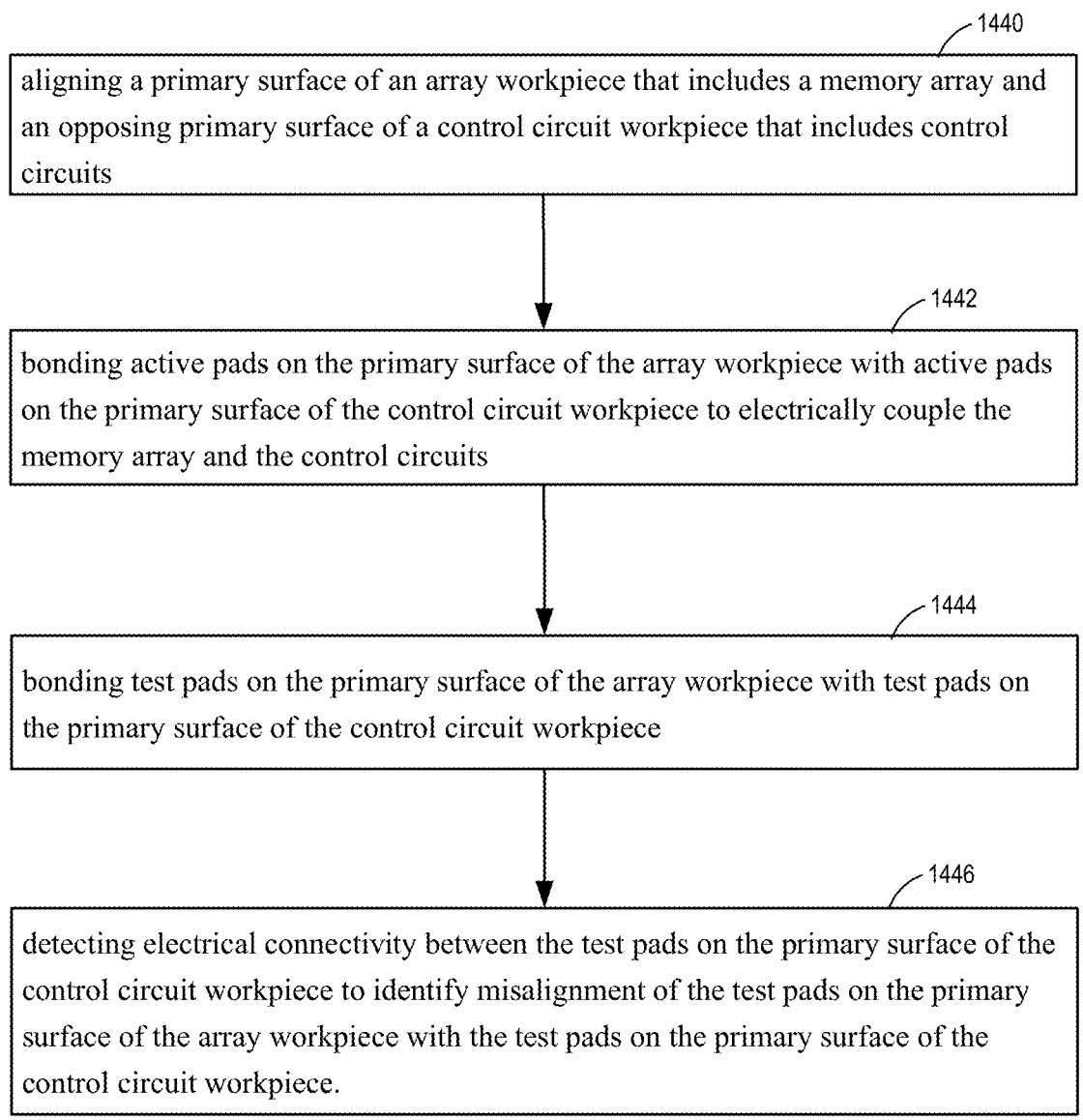
FIG. 14 illustrates an example of a method that includes detecting electrical connectivity to identify misalignment.

One or more components illustrated above may be used in a number of different ways according to methods presented here. For example, FIG. 14 illustrates an example of a method that includes aligning a primary surface of an array workpiece that includes a memory array and an opposing primary surface of a control circuit workpiece that includes control circuits 1440 (e.g. aligning workpiece 500 and workpiece 600), bonding active pads on the primary surface of the array workpiece with active pads on the primary surface of the control circuit workpiece to electrically couple the memory array and the control circuits 1442 (e.g. bonding active pads 508a-d and 608a-d to couple word lines, bit lines, etc.), and bonding test pads on the primary surface of the array workpiece with test pads on the primary surface of the control circuit workpiece 1444 (e.g. bonding test pads 930a-d and 936a-d). The method further includes detecting electrical connectivity between the test pads on the primary surface of the control circuit workpiece to identify misalignment of the test pads on the primary surface of the array workpiece with the test pads on the primary surface of the control circuit workpiece 1446 (e.g. detecting electrical connectivity between test pads 936a, 936b using circuits as illustrated in one or more of the examples above).

Electrical connectivity testing may indicate alignment/misalignment, which may be used to determine what further steps to perform on a combined workpiece, for example, whether the combined workpiece should be scrapped (if misaligned) or if the workpiece should be subject to further testing and/or processing (if aligned). Thus, electrical connectivity testing may act as a quick test that rapidly indicates problems and avoids extensive testing when misalignment occurs.

Figure 15:
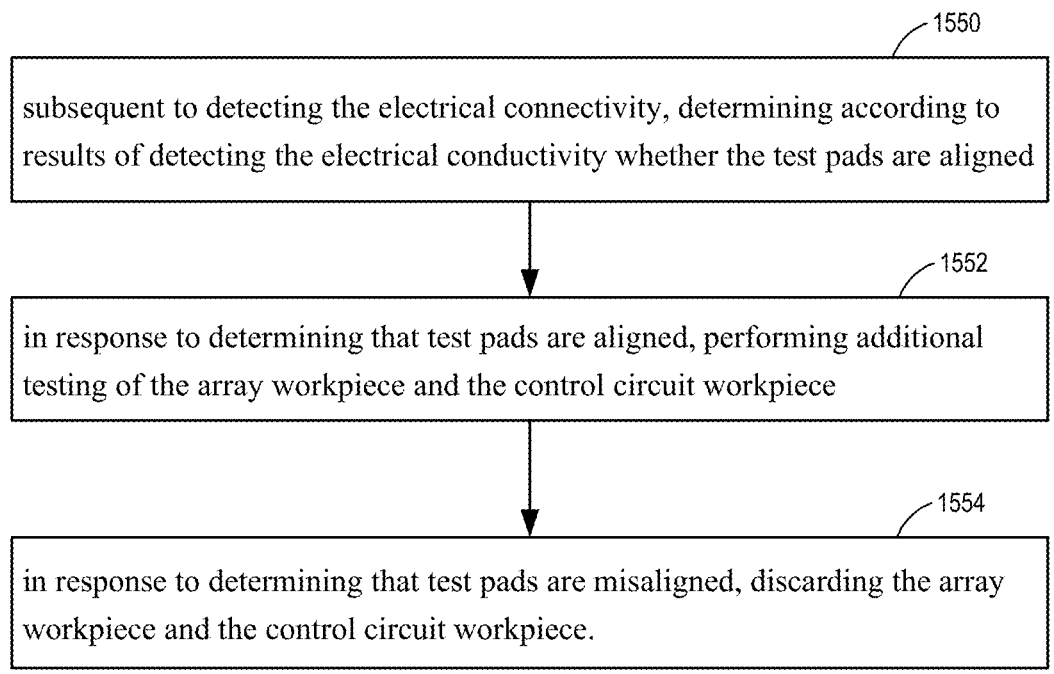
FIG. 15 illustrates an example of a method that includes discarding in response to determining misalignment.

FIG. 15 illustrates an example of using results of electrical connectivity detection including, subsequent to detecting the electrical connectivity, determining according to results of detecting the electrical conductivity whether the test pads are aligned 1550, in response to determining that test pads are aligned, performing additional testing of the array workpiece and the control circuit workpiece 1552 (e.g. proceeding with extensive wafer-level testing), and in response to determining that test pads are misaligned, discarding the array workpiece and the control circuit workpiece (e.g. discarding the combined wafer, or any combined die that has misalignment).

Figure 16:
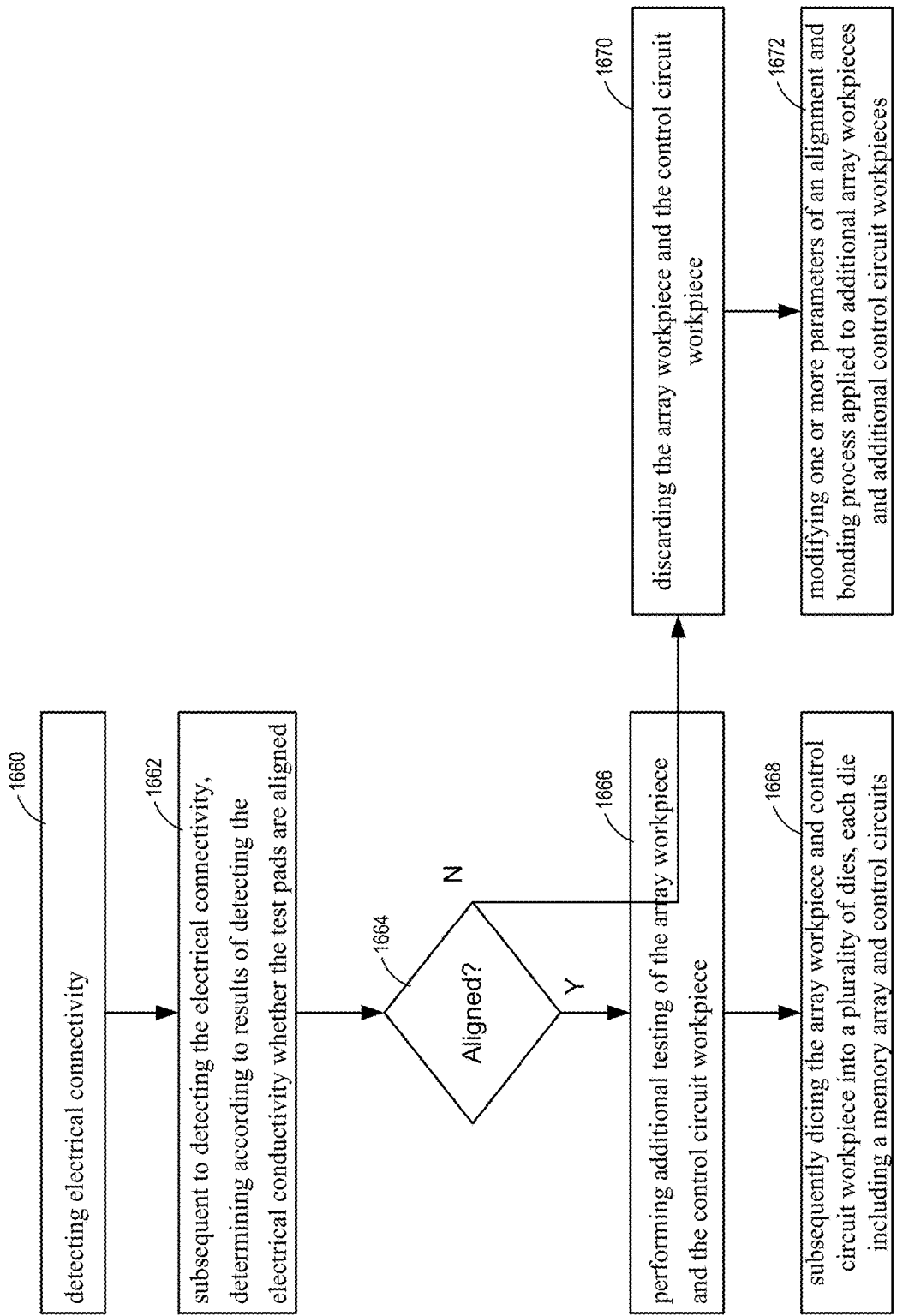
FIG. 16 shows a flowchart including actions in response to determining alignment/misalignment.

FIG. 16 illustrates a method that includes detecting electrical connectivity 1660 (e.g. as described in any of the above examples) and subsequent to detecting the electrical connectivity, determining according to results of detecting the electrical conductivity whether the test pads are aligned 1662. FIG. 16 shows, in response to determining that test pads are aligned 1664, performing additional testing of the array workpiece and the control circuit workpiece 1666 and subsequently dicing the array workpiece and control circuit workpiece into a plurality of dies, each die including a memory array and control circuits 1668. For example, wafer-level testing may be performed to test the functionality of circuits including memory arrays and control circuits and, if these results are successful, the wafer may be diced into individual dies which may then be further processed (e.g. packaged, subject to die-level testing, configuration/initialization, incorporation into larger assemblies, etc.). FIG. 16 further shows, in response to determining that test pads are misaligned 1664, discarding the array workpiece and the control circuit workpiece 1670 (i.e. combined wafer, or one or more combined dies of the combined wafer are scrapped) and modifying one or more parameters of an alignment and bonding process applied to additional array workpieces and additional control circuit workpieces 1672. Thus, in some cases, feedback may be provided based on results of electrical connectivity testing to improve alignment and bonding of wafers. Such feedback may be rapidly provided so that problems can be addressed before a large amount of product wafers are scrapped. Electrical connectivity testing according to any of the examples described above may be implemented soon or immediately after wafer-to-wafer bonding so that any problems are identified and rectified rapidly.

An example of an apparatus includes: a first workpiece including first active pads, a first test pad, and a second test pad on a primary surface of the first workpiece, the first test pad electrically connected to the second test pad; a second workpiece including second active pads, a third test pad, and a fourth test pad on a primary surface of the second workpiece, the first and second workpieces bonded along an interface between the primary surface of the first workpiece and the primary surface of the second workpiece to bond the first active pads with the second active pads, bond the first test pad with the third test pad, and bond the second test pad with the fourth test pad; and connectivity detection circuits to test electrical connectivity between the third test pad and the fourth test pad.

In an example, the connectivity detection circuits are in the second workpiece. In an example, the connectivity detection circuits include a comparator to compare a voltage at the fourth test pad with a reference voltage. In an example, the connectivity detection circuits further include a multiplexer to selectively couple the third test pad and the fourth test pad to compare voltages at the third test pad and the fourth test pad with the reference voltage. In an example, the connectivity detection circuits include an exclusive OR (XOR) circuit coupled to the second test pad and the third test pad. In an example, the third test pad is connected to a current sink, the fourth test pad is connected to an exposed pad, and the connectivity detection circuits include a current source and current meter coupled to the exposed pad. In an example, the first workpiece is an array workpiece that includes a memory array and the second workpiece is a control circuit workpiece a includes control circuits. In an example, the first active pads are connected to bit lines and word lines in the memory array and the second active pads are connected to read/write circuits and row decoder circuits in the control circuit workpiece. In an example, the memory array is a 3D non-volatile memory array monolithically formed in one or more physical levels of arrays of memory cells having an active area disposed above a silicon substrate. In an example, the first workpiece includes additional test pads in addition to the first and second test pads, the second workpiece includes corresponding additional test pads in addition to the third and fourth test pads, and the connectivity detection circuits are configured to test electrical connectivity of bonds between the additional test pads and the corresponding additional test pads.

An example of a method includes: aligning a primary surface of an array workpiece that includes a memory array and an opposing primary surface of a control circuit workpiece that includes control circuits; bonding active pads on the primary surface of the array workpiece with active pads on the primary surface of the control circuit workpiece to electrically couple the memory array and the control circuits; bonding test pads on the primary surface of the array workpiece with test pads on the primary surface of the control circuit workpiece; and detecting electrical connectivity between the test pads on the primary surface of the control circuit workpiece to identify misalignment of the test pads on the primary surface of the array workpiece with the test pads on the primary surface of the control circuit workpiece.

In an example, the method further includes: subsequent to detecting the electrical connectivity, determining according to results of detecting the electrical conductivity whether the test pads are aligned; in response to determining that test pads are aligned, performing additional testing of the array workpiece and the control circuit workpiece; and in response to determining that test pads are misaligned, discarding the array workpiece and the control circuit workpiece. In an example, the method further includes: in response to determining that the test pads are aligned, subsequently dicing the array workpiece and control circuit workpiece into a plurality of dies, each die including a memory array and control circuits. In an example, the method further includes: in response to determining that the test pads are misaligned, modifying one or more parameters of an alignment and bonding process applied to additional array workpieces and additional control circuit workpieces. In an example, detecting electrical connectivity between the test pads on the primary surface of the control circuit workpiece to identify misalignment includes determining electrical connectivity by connectivity detection circuits located in the control circuit workpiece. In an example, detecting electrical connectivity between the test pads on the primary surface of the control circuit workpiece includes comparing voltage from one or more test pad on the primary surface of the control circuit workpiece with another voltage from another test pad on the primary surface of the control circuit workpiece or with a reference voltage. In an example, detecting electrical connectivity between the test pads on the primary surface of the control circuit workpiece to identify misalignment includes coupling connectivity detection circuits to one or more exposed pads on the control circuit workpiece.

An example of a non-volatile storage apparatus includes: an array workpiece that includes an array of non-volatile memory cells; a control circuit workpiece that includes control circuits, the control circuit workpiece wafer-to-wafer bonded to the array workpiece such that the control circuits are electrically coupled to the array of non-volatile memory cells; and means for detecting electrical connectivity between pads on the control circuit workpiece and pads on the array workpiece to identify misalignment between the array workpiece and the control circuit workpiece.

In an example, the means for detecting electrical connectivity is located in the control circuit workpiece and includes means for comparing a voltage from a first pad on the control circuit workpiece with a voltage from a second pad on the control circuit workpiece or a reference voltage. In an example, the means for detecting electrical connectivity is coupled to the pads on the control circuit workpiece through one or more exposed pads on the control circuit workpiece.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a first workpiece including first active pads, a first test pad, and a second test pad on a primary surface of the first workpiece, the first test pad electrically connected to the second test pad by a conductive path in the first workpiece;
   a second workpiece including second active pads, a third test pad, and a fourth test pad on a primary surface of the second workpiece, the first and second workpieces bonded along an interface between the primary surface of the first workpiece and the primary surface of the second workpiece to bond the first active pads with the second active pads, bond the first test pad with the third test pad, and bond the second test pad with the fourth test pad; and connectivity detection circuits in the second workpiece, the connectivity detection circuits configured to test electrical connectivity between the third test pad and the fourth test pad, the connectivity detection circuits include an exclusive OR (XOR) circuit coupled to the fourth test pad and the third test pad to compare the voltage at the fourth test pad with the voltage at the third test pad.

2. The apparatus of claim 1 wherein the connectivity detection circuits are formed of logic components in an active layer in the second workpiece.

3. The apparatus of claim 1 wherein the first workpiece is a first silicon wafer and the second substrate is a second silicon wafer.

4. The apparatus of claim 3 wherein the first silicon wafer includes a plurality of memory dies formed by a first fabrication process and the second silicon wafer includes a plurality of control circuit dies formed by a second fabrication process.

5. The apparatus of claim 1 wherein the XOR circuit is coupled to four or more test pads of the second workpiece to compare voltages at the four or more test pads.

6. The apparatus of claim 1 wherein the conductive path in the first workpiece includes only passive components.

7. The apparatus of claim 1 wherein the first workpiece is an array workpiece that includes a memory array and the second workpiece is a control circuit workpiece that includes control circuits.

8. The apparatus of claim 7 wherein the first active pads are connected to bit lines and word lines in the memory array and the second active pads are connected to read/write circuits and row decoder circuits in the control circuit workpiece.

9. The apparatus of claim 7 wherein the memory array is a 3D non-volatile memory array monolithically formed in one or more physical levels of arrays of memory cells having an active area disposed above a silicon substrate.

10. The apparatus of claim 1 wherein the first workpiece includes additional test pads in addition to the first and second test pads, the second workpiece includes corresponding additional test pads in addition to the third and fourth test pads, and the connectivity detection circuits are configured to test electrical connectivity of bonds between the additional test pads and the corresponding additional test pads.

11. A method comprising:
aligning a primary surface of an array workpiece that includes a memory array and an opposing primary surface of a control circuit workpiece that includes control circuits;
bonding active pads on the primary surface of the array workpiece with active pads on the primary surface of the control circuit workpiece to electrically couple the memory array and the control circuits;
bonding test pads on the primary surface of the array workpiece with test pads on the primary surface of the control circuit workpiece, the test pads on the primary surface of the array workpiece electrically connected together by one or more conductive paths in the array workpiece; and
subsequently detecting, by connectivity detection circuits located in the control circuit workpiece, electrical connectivity between the test pads on the primary surface of the control circuit workpiece, including performing an exclusive OR (XOR) operation on voltages at the test pads on the primary surface of the control circuit to determine if there is a difference between the voltages at the test pads, to identify misalignment of the test pads on the primary surface of the array workpiece with the test pads on the primary surface of the control circuit workpiece.

12. The method of claim 11 further comprising:
subsequent to detecting the electrical connectivity, determining according to results of detecting the electrical conductivity whether the test pads are aligned;
in response to determining that test pads are aligned, performing additional testing of the array workpiece and the control circuit workpiece; and
in response to determining that test pads are misaligned, discarding the array workpiece and the control circuit workpiece.

13. The method of claim 12 further comprising, in response to determining that the test pads are aligned, subsequently dicing the array workpiece and control circuit workpiece into a plurality of dies, each die including a memory array and control circuits.

14. The method of claim 12 further comprising, in response to determining that the test pads are misaligned, modifying one or more parameters of an alignment and bonding process applied to additional array workpieces and additional control circuit workpieces.

15. The method of claim 11 wherein detecting electrical connectivity between the test pads on the primary surface of the control circuit workpiece to identify misalignment includes determining electrical connectivity by CMOS logic components in an active layer of the control circuit workpiece that form the connectivity detection circuits.

16. The method of claim 15 wherein detecting electrical connectivity between the test pads on the primary surface of the control circuit workpiece includes comparing voltage from one or more test pad on the primary surface of the control circuit workpiece with another voltage from another test pad on the primary surface of the control circuit workpiece or with a reference voltage.

17. The method of claim 11 wherein detecting electrical connectivity between the test pads on the primary surface of the control circuit workpiece to identify misalignment includes performing the XOR operation on four or more voltages at four or more test pads on the primary surface of the control circuit to determine if there is a difference between the four or more voltages at the four or more test pads.

18. A non-volatile storage apparatus, comprising:
a control circuit workpiece that includes control circuits, the control circuit workpiece configured to be wafer-to-wafer bonded to an array workpiece such that the control circuits are electrically coupled to an array of non-volatile memory cells in the array workpiece; and
means for detecting electrical connectivity between pads on the control circuit workpiece and pads on a surface of the array workpiece that are electrically connected together by one or more conductive paths in the array workpiece to identify misalignment between the array workpiece and the control circuit workpiece, the means for detecting electrical connectivity located in the control circuit workpiece, the means for detecting electrical connectivity including an exclusive OR (XOR) circuit coupled to two or more pads on the control circuit workpiece to compare voltages at the two or more pads.

19. The non-volatile storage apparatus of claim 18 wherein the XOR circuit is coupled to four or more pads on the control circuit workpiece to compare voltages at the four or more pads.

20. The non-volatile storage apparatus of claim 18 wherein the means for detecting electrical connectivity is formed of CMOS logic components in an active layer of the control circuit workpiece.

* * * * *